US011582875B2

(12) United States Patent  
Okura et al.

(10) Patent No.: US 11,582,875 B2  
(45) Date of Patent: Feb. 14, 2023

(54) RAIL MOUNT DEVICE WITH LOCKING MEMBER AND RELEASE BUTTON

(71) Applicant: Mitsubishi Electric Corporation, Tokyo (JP)

(72) Inventors: Kenichiro Okura, Tokyo (JP); Tomoki Okuno, Tokyo (JP); Kozo Shirota, Tokyo (JP); Masakazu Taketomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 25 days.

(21) Appl. No.: 17/280,970

(22) PCT Filed: Dec. 20, 2018

(86) PCT No.: PCT/JP2018/046997  
§ 371 (c)(1),  
(2) Date: Mar. 29, 2021

(87) PCT Pub. No.: WO2020/129214  
PCT Pub. Date: Jun. 25, 2020

(65) Prior Publication Data  
US 2021/0360806 A1    Nov. 18, 2021

(51) Int. Cl.  
*H05K 5/02* (2006.01)  
*F24F 11/89* (2018.01)  
*H05K 7/12* (2006.01)

(52) U.S. Cl.  
CPC .......... *H05K 5/0217* (2013.01); *F24F 11/89* (2018.01); *H05K 7/12* (2013.01)

(58) Field of Classification Search  
CPC ...... H05K 5/0217; H05K 7/12; H05K 7/1474; F24F 11/89  
See application file for complete search history.

(56) References Cited

U.S. PATENT DOCUMENTS

2016/0081215 A1    3/2016    Boretti

FOREIGN PATENT DOCUMENTS

| JP | S61-038979 U | 3/1986 |
|----|--------------|--------|
| JP | H1-169682 U  | 11/1989 |

(Continued)

OTHER PUBLICATIONS

International Search Report dated Mar. 19, 2019 issued in the corresponding International Application Mo. PCT/JP2018/046997( and English translation).

(Continued)

*Primary Examiner* — James Wu  
*Assistant Examiner* — Hung Q Dang  
(74) *Attorney, Agent, or Firm* — Posz Law Group, PLC

(57) ABSTRACT

A device includes a housing including a rail mount and a stopper to lock an engagement flange (RAb) on a DIN rail (RA) with the rail mount receiving the DIN rail (RA). A locking member is at a locking position to lock an engagement flange (RAb) on the DIN rail (RA) and at a release position to unlock the engagement flange (RAb) with the rail mount receiving the DIN rail (RA). A release button including a pressing portion to be pressed by a user is located in the housing with the pressing portion exposed outside the housing. An arm moves the locking member from the locking position to the release position in response to movement of the release button from a standby position to a pressed position deeper in the housing than the standby position.

10 Claims, 49 Drawing Sheets

(56) References Cited

FOREIGN PATENT DOCUMENTS

| JP | H07-162167 | A  | 6/1995 |
|----|------------|----|--------|
| JP | 2006-68852 | A  | 3/2006 |
| JP | 2006-253531 | A | 9/2006 |
| JP | 2012-114206 | A | 6/2012 |
| WO | 2016/038933 | A1 | 3/2016 |

OTHER PUBLICATIONS

Office Action dated Dec. 7, 2021, issued in corresponding JP Patent Application No. 2020-560726 (and English Machine Translation).
Office Action (Decision of Refusal) dated May 10, 2022, issued for the corresponding JP Patent Application No. 2020-560726 (and English translation).
Office Action dated Oct. 4, 2022, issued in corresponding JP Patent Application No. 2020-560726 (and English Machine Translation).

RAIL MOUNT DEVICE WITH LOCKING MEMBER AND RELEASE BUTTON

CROSS REFERENCE TO RELATED APPLICATION

This application is a U.S. national stage application of International Patent Application No. PCT/JP2018/046997 filed on Dec. 20, 2018, the disclosure of which is incorporated herein by reference.

TECHNICAL FIELD

The present disclosure relates to a device.

BACKGROUND ART

A known electric device includes a mount having a fitting groove for receiving a DIN rail and an immobile stopper on one side surface of the fitting groove, and a movable body installed on the other side surface of the fitting groove and tipped with a movable stopper (see, for example, Patent Literature 1). To attach the electric device onto a DIN rail, the DIN rail is fitted in the fitting groove, and the movable body is moved to hold the two edges in the width direction of the DIN rail with the immobile stopper and the movable stopper. The movable body has a part protruding from the rear surface of the electric device, and a user can pinch the part to move the movable body. The movable body also includes an engagement section, and the mount has an engagement groove that receives the engagement section of the movable body. When the movable body is moved to a position at which the edges of the DIN rail are held with the bottom surface of the fitting groove and the movable stopper, the engagement section is fitted into the engagement groove to lock the movable body.

PATENT LITERATURE

Patent Literature 1. Unexamined Japanese Patent Application Publication No. 2006-068852

When the electric device described in Patent Literature 1 is detached from the DIN rail, the part of the movable body protruding from the electric device is pinched, and the engagement section of the movable body fitted in the engagement groove in the mount is forced out of the engagement groove. For a DIN rail fixed on the wall of a building part, the part of the movable body protruding from the rear surface of the electric device is close to the wall of the building part. At this position, pinching the movable body is difficult. Applying a force to the movable body is difficult when the electric device is detached from the DIN rail. The engagement section of the movable body is thus difficult to disengage from the engagement groove. The workability may be lower.

In response to the above issue, an objective of the present disclosure is to provide a device easily attachable to and detachable from a rail.

SUMMARY

To achieve the above objective, a device according to an aspect of the present disclosure is attachable to a rail being elongated and including engagement flanges on two lateral edges of the rail. The device includes a housing including a rail mount to receive the rail with a longitudinal direction of the rail aligned with a predetermined first direction, and a stopper to lock an engagement flange on a first lateral edge of the rail with the rail mount receiving the rail, a locking member to be at a locking position to lock an engagement flange on a second lateral edge of the rail and at a release position to unlock the engagement flange on the second lateral edge with the rail mount receiving the rail, a release button including a pressing portion to be pressed by a user to move the locking member to the release position and located in the housing with the pressing portion exposed outside the housing, and a driver to move the locking member from the locking position to the release position in response to movement, by a press of the pressing portion, of the release button from a predetermined standby position to a pressed position deeper in the housing than the standby position.

The locking member according to the above aspect of the present disclosure may, with a rail on the rail mount, be at a locking position to lock an engagement flange on the rail, and a release position to unlock the engagement flange. The release button is located in the housing with the pressing portion exposed outside the housing. The driver moves the locking member from the locking position to the release position as the release button moves from the standby position to the pressed position in response to a press of the pressing portion. This structure enables the user to move the locking member from the locking position to the release position simply by pressing the pressing portion of the release button to move the release button from the standby position to the pressed position. The user can thus easily attach or detach the device to or from the rail.

DETAILED DESCRIPTION

Embodiment 1

A device according to Embodiment 1 of the present disclosure will now be described with reference to the drawings. The device according to the present embodiment is, for example, a controller attached to a DIN rail on a building wall and connected to a target device to be operated such as an air conditioner (not shown) with a signal line. The device transmits control signals corresponding to the user operations to the target device to control the target device.

Figure 1:
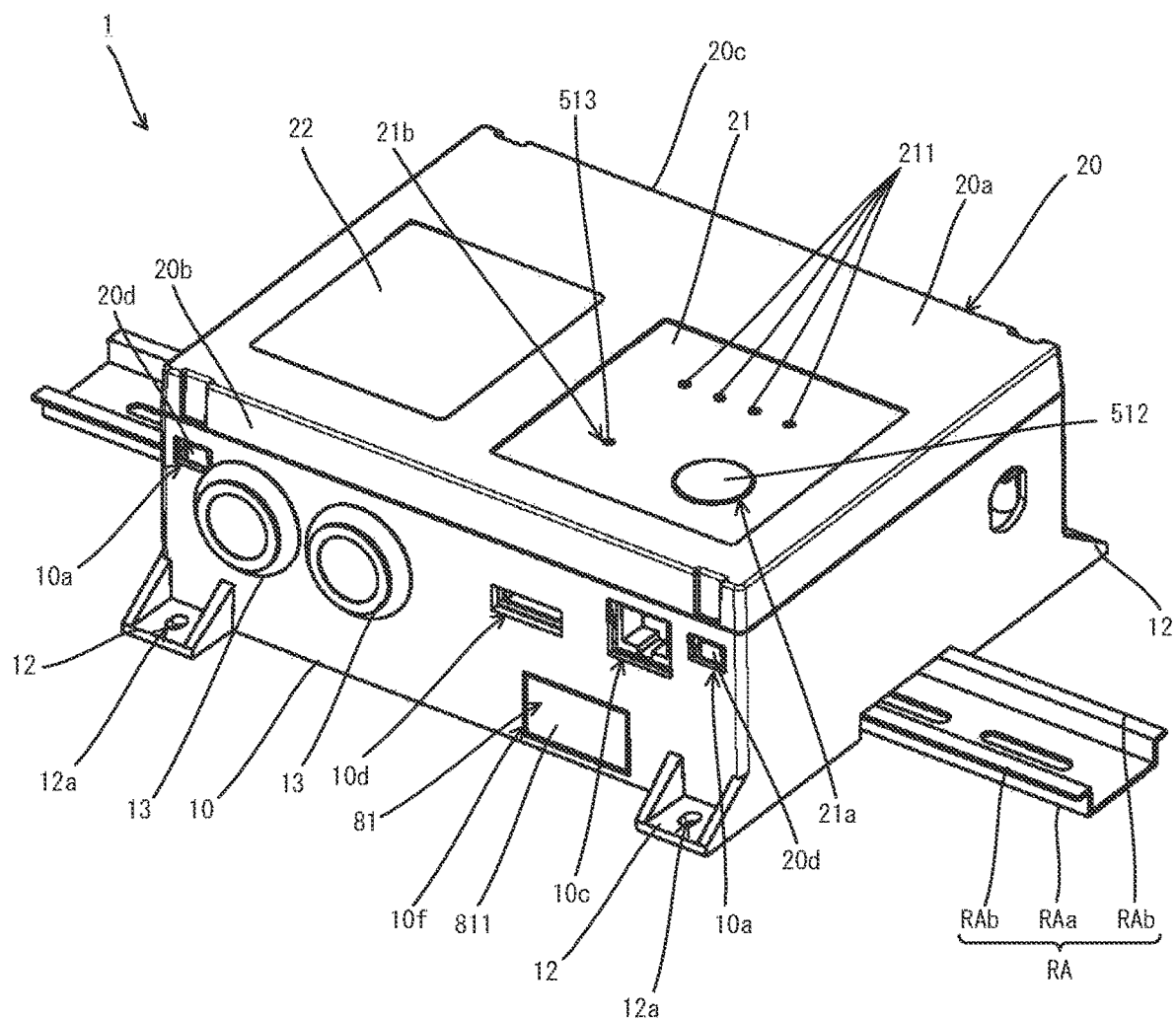
FIG. 1 is a perspective view of a device according to Embodiment 1 of the present disclosure.
Figure 2A:
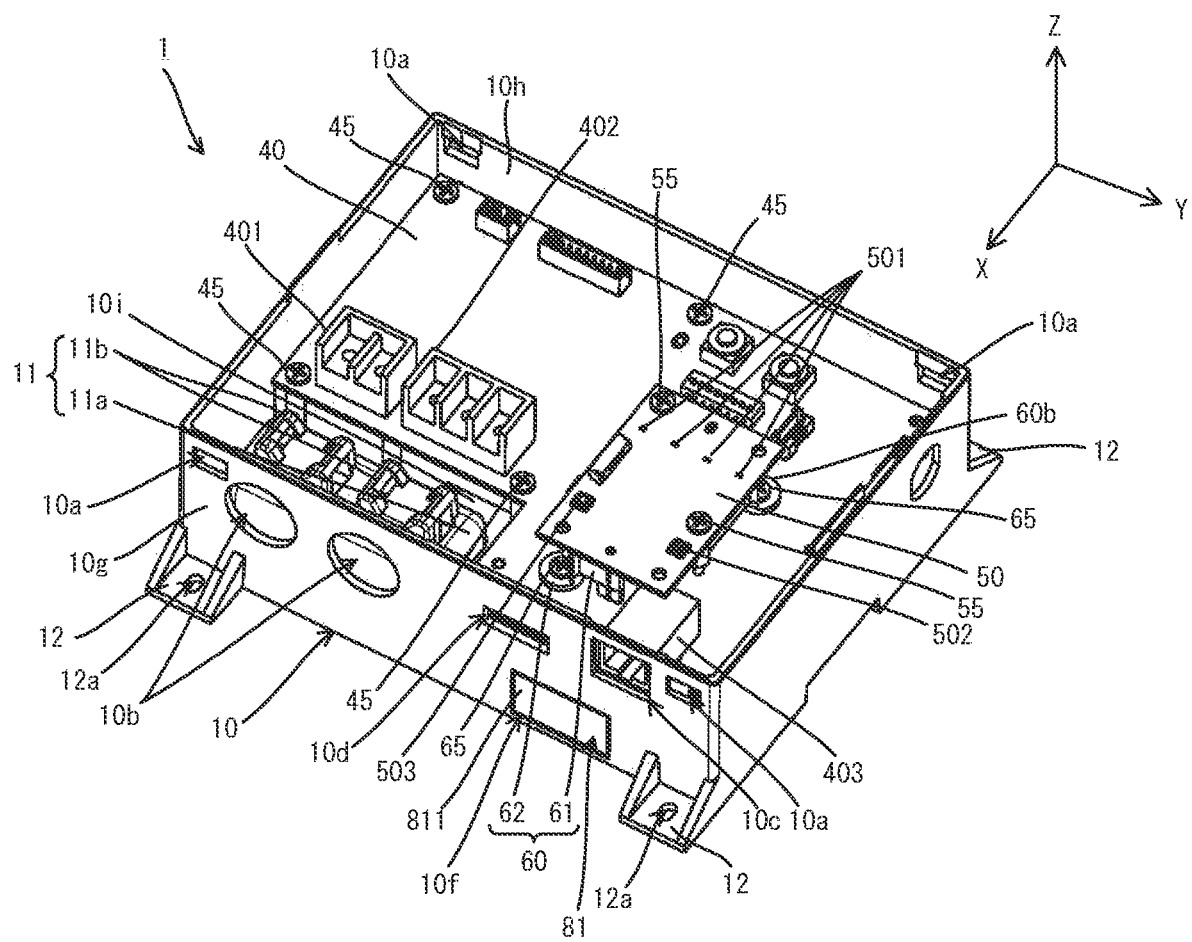
FIG. 2A is a partial perspective view of the device according to Embodiment 1.
Figure 2B:
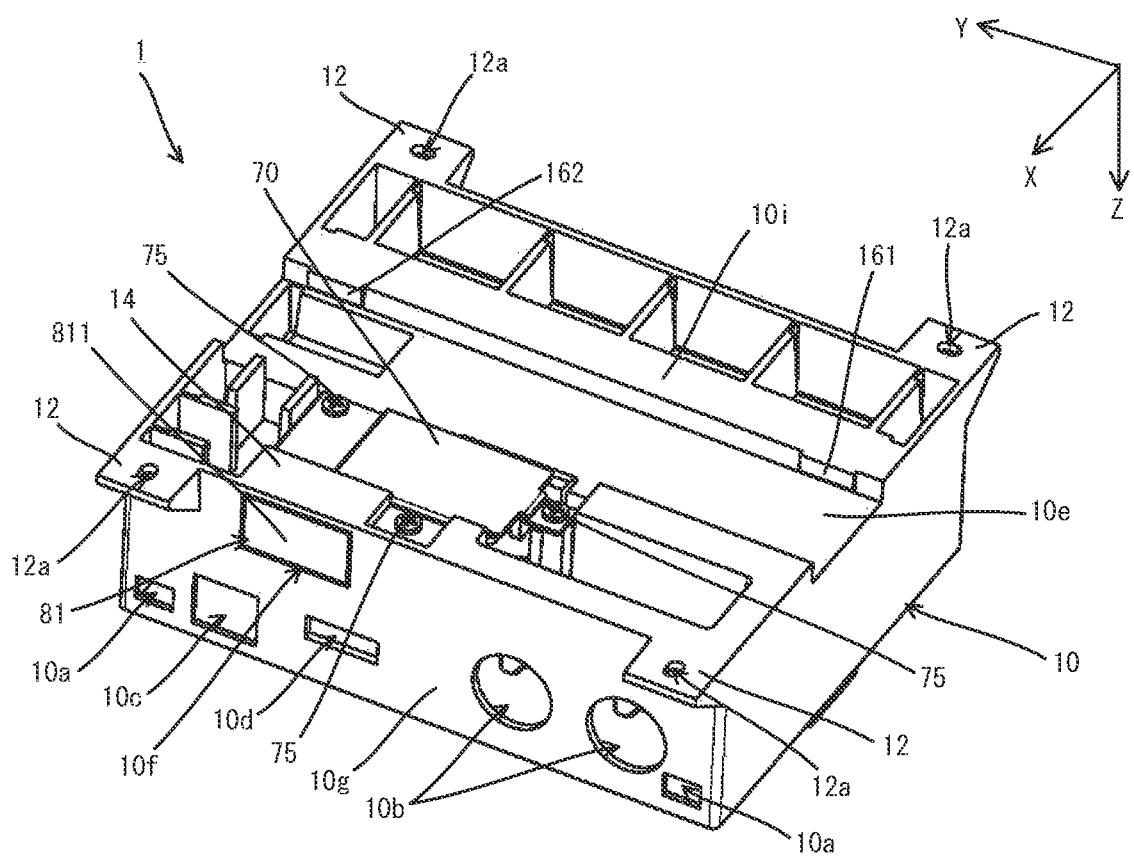
FIG. 2B is a partial perspective view of the device according to Embodiment 1.
Figure 3:
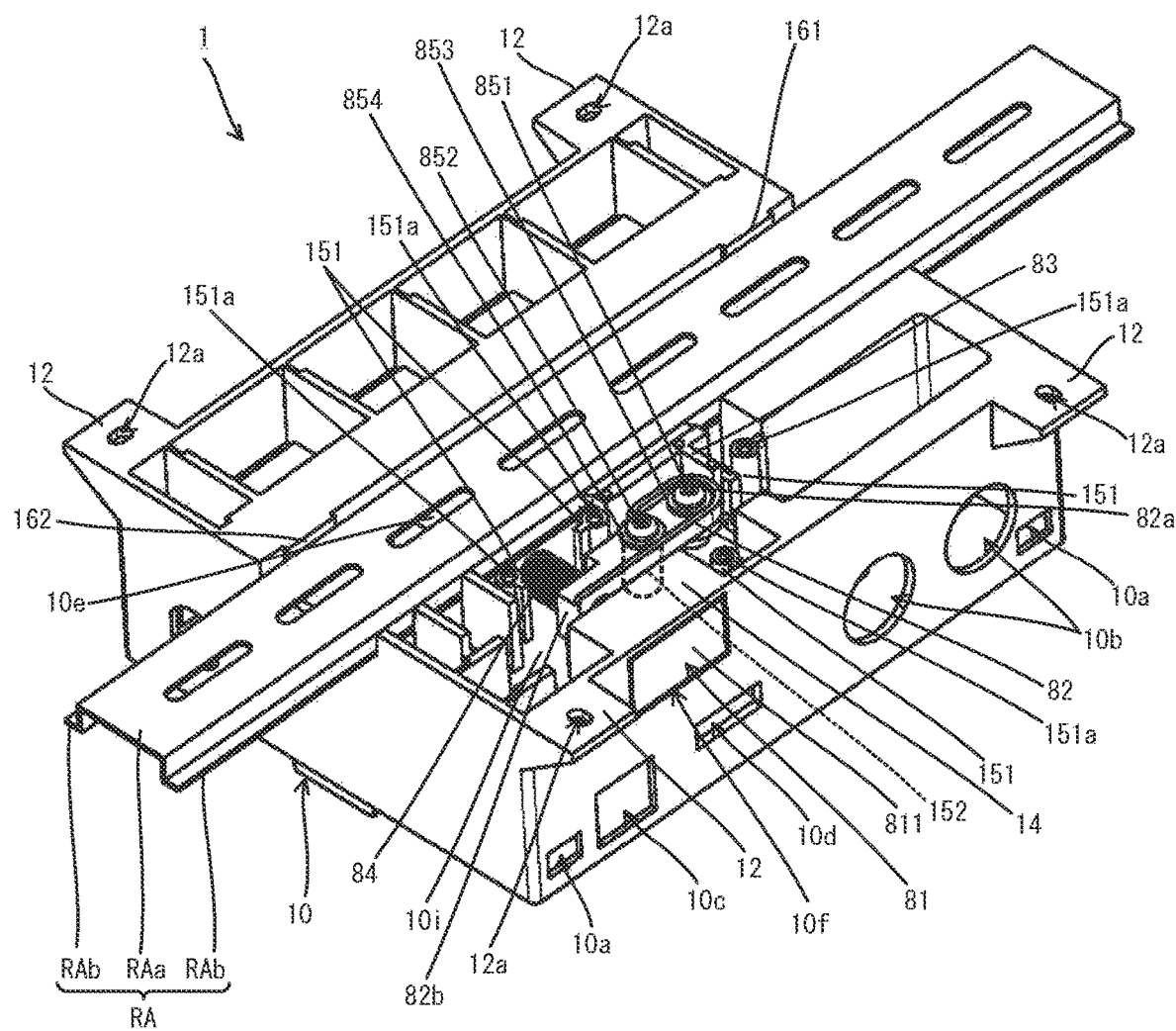
FIG. 3 is a perspective view of the device according to Embodiment 1 attached to a DIN rail.
Figure 3:
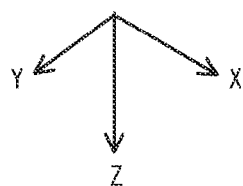

As shown in FIG. 1, a device 1 includes a housing 10 attachable to a DIN rail RA, and a front cover 20 attached to the housing 10 to cover the front of the housing 10. The DIN rail RA is formed from metal or resin. The DIN rail RA includes an elongated rail body RAa with a squared C-shaped cross section, and engagement flanges RAb on the two lateral edges of the rail body RAa. As shown in FIG. 2A, the device 1 further includes a control board 40 that outputs control signals to the air conditioner, a display board 50 that displays the operating state of the device 1, and a spacer 60 between the control board 40 and the display board 50. As shown in FIG. 2B, the device 1 further includes a release button 81 that has a pressing portion 811 to be pressed by a user and is located on the housing 10 with the pressing portion 811 exposed outside the housing 10, and a rear cover 70 that partially covers a bottom wall 10$i$ included in the housing 10 from the rear surface of the housing 10. As shown in FIG. 3, the device 1 further includes a locking member 83 that locks the corresponding engagement flange RAb on the DIN rail RA, an arm 82, and a coil spring 84 that urges the release button 81 in +X-direction. The longitudinal direction of the DIN rail RA to which the device 1 is attached as shown in FIG. 1 is herein Y-direction, and the width direction of the DIN rail RA is herein X-direction for convenience. Herein, Y-direction corresponds to a predetermined first direction, and X-direction corresponds to a second direction perpendicular to the first direction. Herein, +Z-direction is referred to as the direction of the front surface, and −Z-direction is referred to as the direction of the rear surface for convenience.

As shown in FIG. 2A, the display board 50 includes a plurality of light emitters 501 that indicate the operating state of the device 1, a power switch 502 used to power the device 1, and a reset switch 503 used to reset the device 1 to the initial state. The light emitters 501 include light-emitting devices such as light-emitting diode (LED) devices or organic electro-luminescence (EL) devices. The display board 50 has through-holes (not shown) in which screws 55 are placed to secure the display board 50 to the spacer 60.

Figure 4:
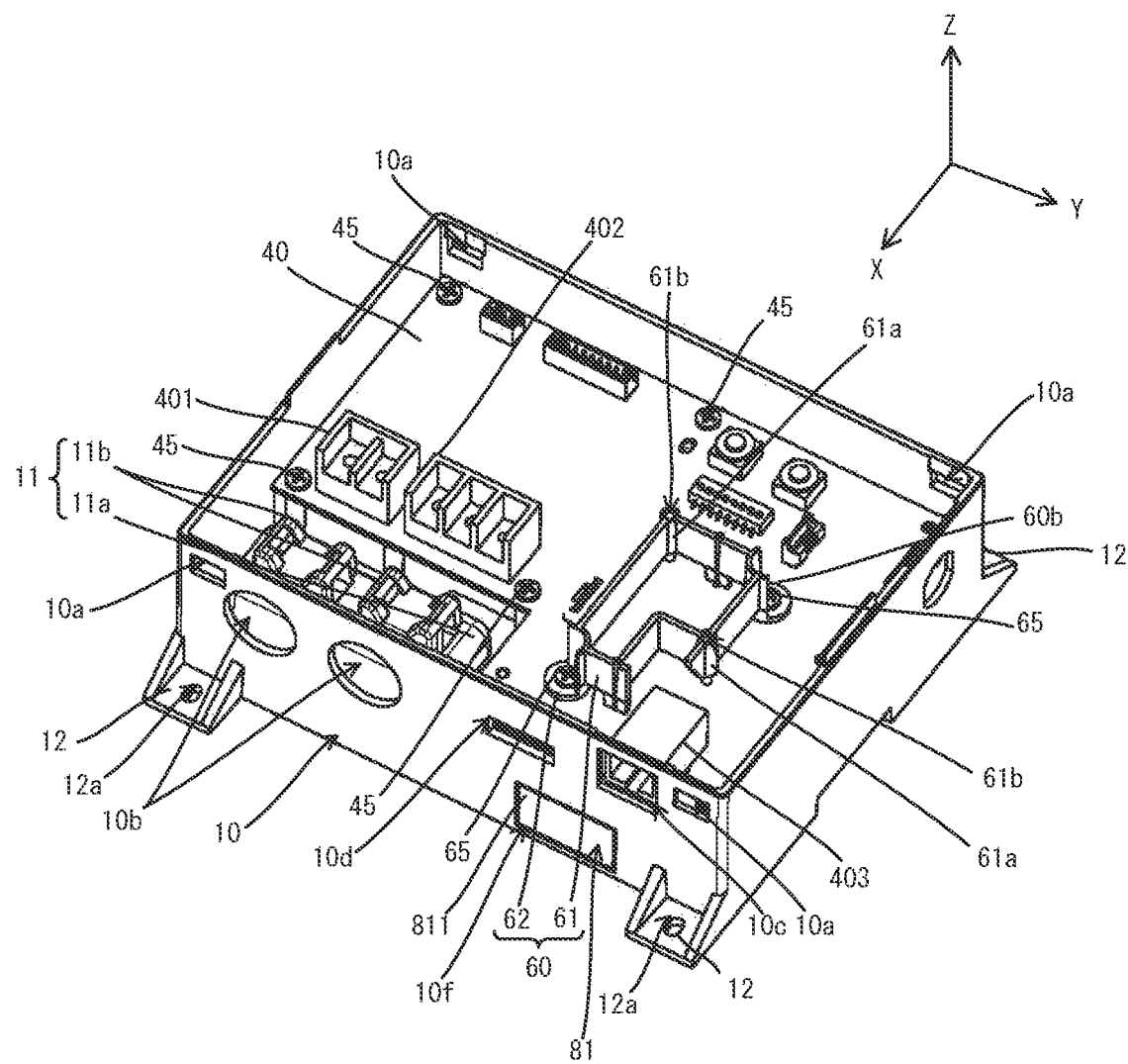
FIG. 4 is a partial perspective view of the device according to Embodiment 1.

The control board 40 outputs control signals to the display board 50 to control the lighting state of each of the light emitters 501 on the display board 50. The control board 40 also generates control signals in response to the operation performed on the power switch 502 and the reset switch 503 of the display board 50, and outputs the control signals to the air conditioner. The control board 40 is installed inside the housing 10 and secured to the housing 10 with screws 45. The control board 40 has terminal mount 401, the terminal mount 402 to which a signal cable (not shown) is connected, and the spacer 60 that supports the display board 50 to space the display board 50 from the control board 40 in +Z-direction. The control board 40 also has a local area network (LAN) connector terminal 403 to which a LAN connector (not shown) is connected, and a universal serial bus (USB) terminal (not shown) to which a USB connector is connected. The terminal mount 401 is connected with a power cable (not shown), and the terminal mount 402 is connected with a signal cable (not shown). As shown in FIG. 4, the spacer 60 includes a spacer body 61 as a frame, and a tab 62 on the edge of the spacer body 61 adjacent to the control board 40. The tab 62 extends in a direction perpendicular to the tube axis direction of the spacer body 61 and has an insertion hole (not shown) that receives a screw 65. The spacer body 61 includes two cylindrical portions 61a each having a threaded hole 61b in the end in +Z-direction. The spacer 60 is fastened together with the control board 40 to the bottom wall 10i of the housing 10 by the screw 65 placed in the insertion hole of the tab 62. The screws 55 placed in the through-holes in the display board 50 are screwed into the threaded holes 61b in the cylindrical portions 61a to secure the display board 50 to the spacer body 61.

As shown in FIG. 2A, the housing 10 is a rectangular box with one face open, and accommodates the display board 50 and the control board 40. The housing 10 has through-holes 10a in side walls 10g and 10h in X-direction for fixing the front cover 20 to the housing 10. The side wall 10g has two through-holes 10b that are circular in a plan view for leading the power cable and the signal cable into the housing 10, a through-hole 10c that is rectangular in a plan view for receiving the LAN connector, and a through-hole 10d that is rectangular in a plan view for receiving the USB connector. The side wall 10g also has an opening 10f that exposes the pressing portion 811 of the release button 81 outside the housing 10. The housing 10 includes a clamp 11 in +Z direction of the bottom wall 10i. The clamp 11 includes a base 11a and fasteners 11b that extend from the base 11a and hold ties clamping the power cable and the signal cable. As shown in FIG. 1, the through-holes 10b in the side wall 10g receive grommets 13, and the power cable and the signal cable are placed into the housing 10 through through-holes (not shown) formed at the centers of the grommets 13. The housing 10 also includes two tabs 12 extending in +X-direction from the ends in −Z-direction of the two edges of the side wall 10g in Y-direction, and two tabs 12 extending in −X-direction from the ends in −Z-direction of the two edges of the side wall 10h in Y-direction. Each tab 12 has a through-hole 12a that receives a screw (shown) for securing the housing 10 to a building part.

As shown in FIG. 2B, the housing 10 has, in −Z-direction of the bottom wall 10i, a rail mount 10e to receive the DIN rail RA is placed with the length of the DIN rail RA aligned with the Y axis, and two stoppers 161 and 162. As shown in FIG. 3, the stoppers 161 and 162 lock the engagement flange RAb on the edge of the DIN rail RA in −X-direction with the rail mount 10e receiving the DIN rail RA. The housing 10 also has a plurality of ribs 151 upright in −Z-direction of the bottom wall 10i for fixing the rear cover 70 to the housing 10. Each rib 151 has a threaded hole 151a in the distal end.

Figure 5A:
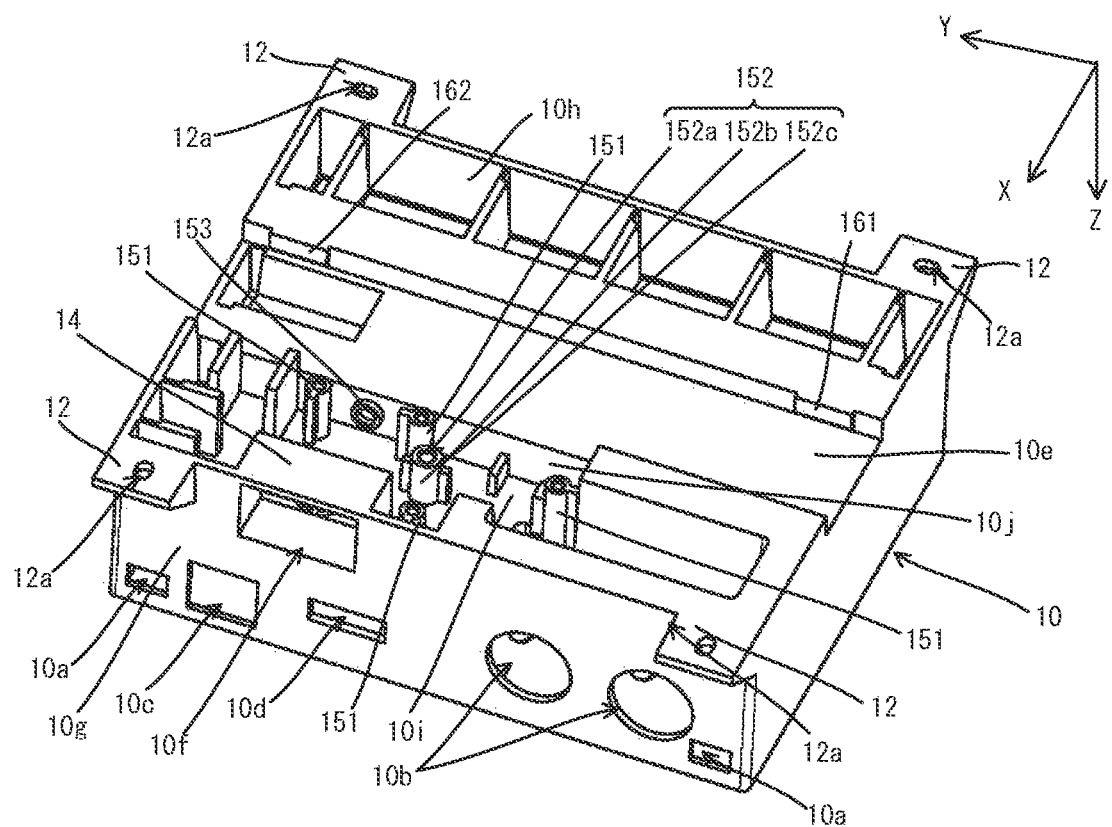
FIG. 5A is a perspective view of a housing in Embodiment 1.
Figure 5B:
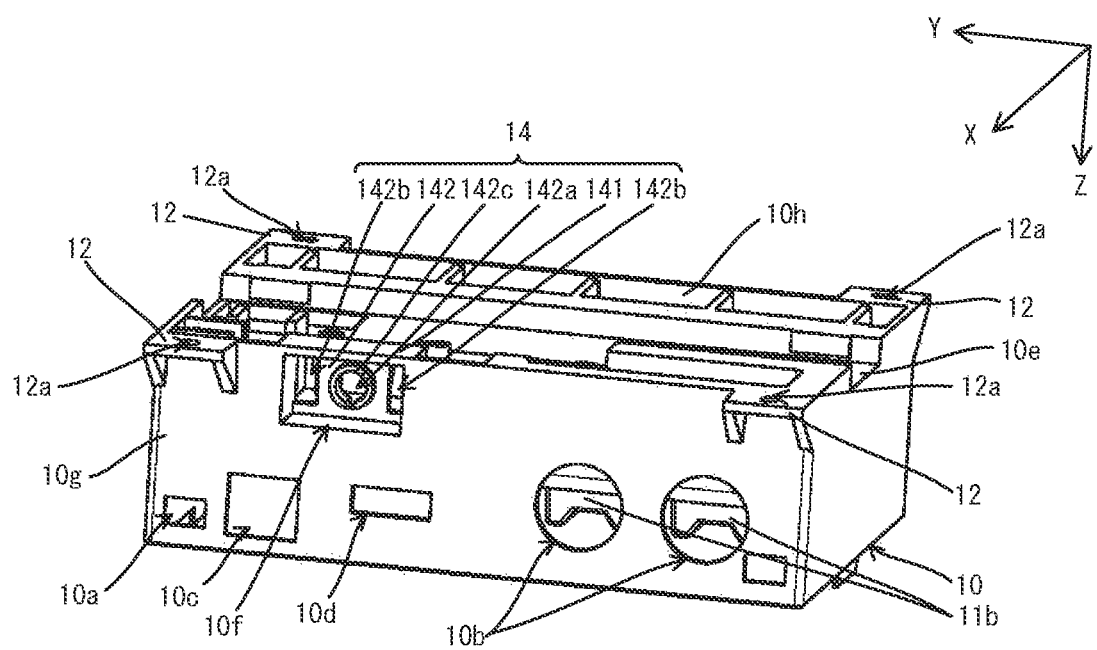
FIG. 5B is a perspective view of the housing in Embodiment 1.

The housing 10 has a support rib 152 on the bottom wall 10i for pivotally supporting a central portion of the arm 82. As shown in FIG. 5A, the support rib 152 is cylindrical and includes a rib body 152b with a threaded hole 152a in the distal end, and a blade 152c extending from the side surface of the rib body 152b in a direction perpendicular to the direction in which the rib body 152b protrudes. Additionally, as shown in FIG. 5B, the housing 10 includes a tubular portion 14 as a closed-bottomed square tube with the tube axis aligned with the X axis, and the tubular portion 14 receives the release button 81 that is movable inside in X-direction. The tubular portion 14 includes a body 141 as a square tube extending from the outer periphery of the opening 10f in the inner wall of the side wall 10g, and a bottom wall 142 covering the end of the body 141 in −X-direction. The bottom wall 142 has a central through-hole 142a that is circular in a plan view, and through-holes 142b that are rectangular in a plan view in the two ends in Y-direction. The through-hole 142a in the bottom wall 142 has an annular projection 142c protruding in +X-direction from the outer periphery of the through-hole 142a. The bottom wall 10i of the housing 10 further includes a step 10j having arise in Z-direction. The step 10j has an annular projection 153 fitted in the coil spring 84.

As shown in FIG. 1, the front cover 20 is a flat rectangular box with an open face in −Z-direction, and includes a bottom wall 20a as a rectangular plate and side walls 20b and 20c extending in −Z-direction from two opposite sides of the bottom wall 20a in X-direction. The bottom wall 20a has a plurality of (four in FIG. 1) through-holes (not shown) that allow passage of light emitted from the light emitters 501 located on the display board 50, a through-hole (not shown) that receives a power button 512, and a through-hole (not shown) that receives a reset button 513. The power button 512 and the reset button 513 are fixed in −Z-direction of the bottom wall 20a and supported by a button support (not shown) that holds the power button 512 and the reset button 513 to be movable in Z-direction. The button support holds the power button 512 and the reset button 513 urged in +Z-direction by an urging member (not shown). With the front cover 20 attached to the housing 10, the power button 512 and the reset button 513 face the power switch 502 and the reset switch 503 on the display board 50. Additionally, the bottom wall 20a has a translucent sheet 21 in a front surface area including the power button 512 and the reset button 513. The sheet 21 has openings 21a and 21b that receive the power button 512 and the reset button 513 at the positions corresponding to the power button 512 and the reset button 513. The sheet 21 also has diffusers 211 that scatter and diffuse light at sites over the through-holes in the bottom wall 20a for passage of light emitted from the light emitters 501. On the bottom wall 20a, a label 22 printed with the model and the specifications of the device 1 is also at a position adjacent to the sheet 21 in −Y-direction. The side walls 20b and 20c each have engagement tabs 20d that extend in −Z-direction from the two edges in Y-direction with the distal ends engaging the through-holes 10a in the housing 10.

As shown in FIG. 2B, the rear cover 70 partially covers the arm 82 and the locking member 83 from the rear surface of the housing 10. When the device 1 is attached to the DIN rail RA, the covering prevents a part of the DIN rail RA from hitting against the arm 82 or the locking member 83, thus avoiding damage to the arm 82 or the locking member 83. Moreover, covering the arm 82 or the locking member 83 from the rear surface improves the rear appearance of the device 1. The rear cover 70 has, at three peripheral positions, through-holes (not shown) that receive screws 75. When the screws 75 placed in the through-holes are screwed into the threaded holes 151a in the distal ends of the ribs 151 on the housing 10, the rear cover 70 is secured to the housing 10 to cover a part of the housing 10.

Figure 6A:
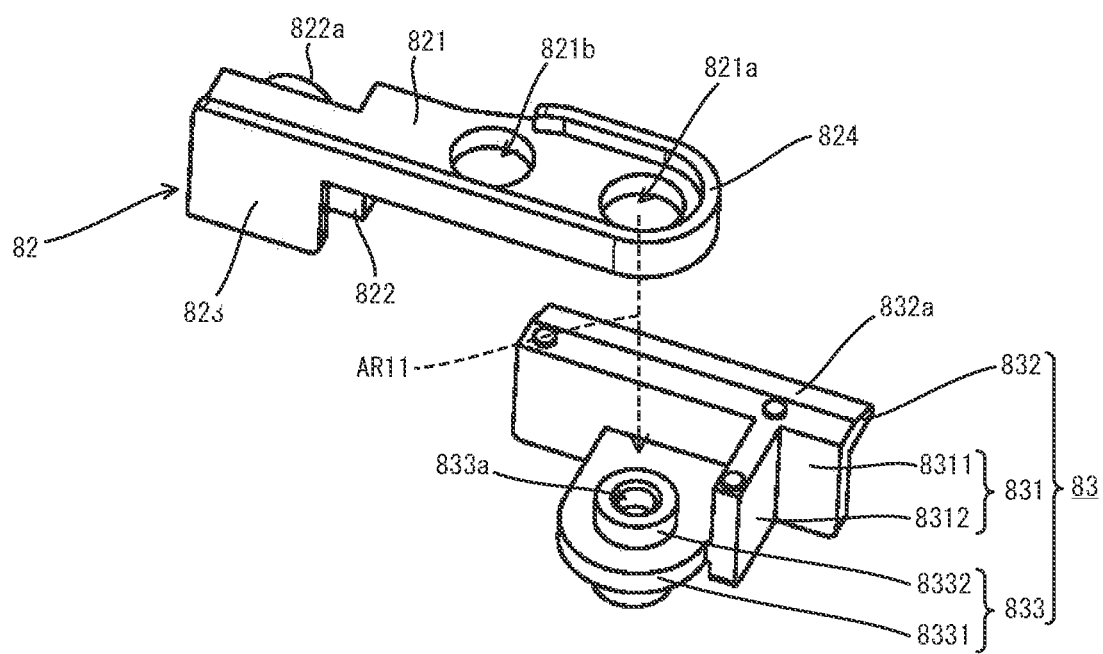
FIG. 6A is a perspective view of an arm and a locking member in Embodiment 1.
Figure 6B:
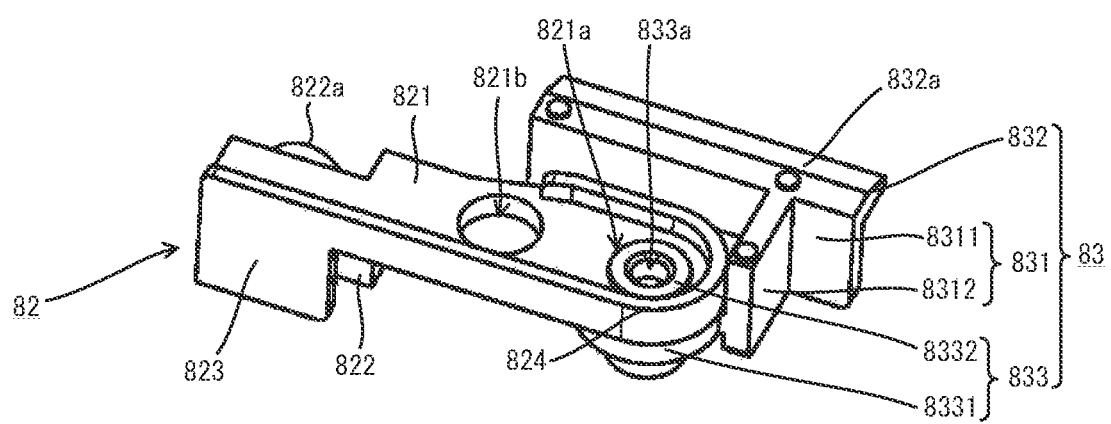
FIG. 6B is a perspective view of the arm and the locking member in Embodiment 1.
Figure 6C:
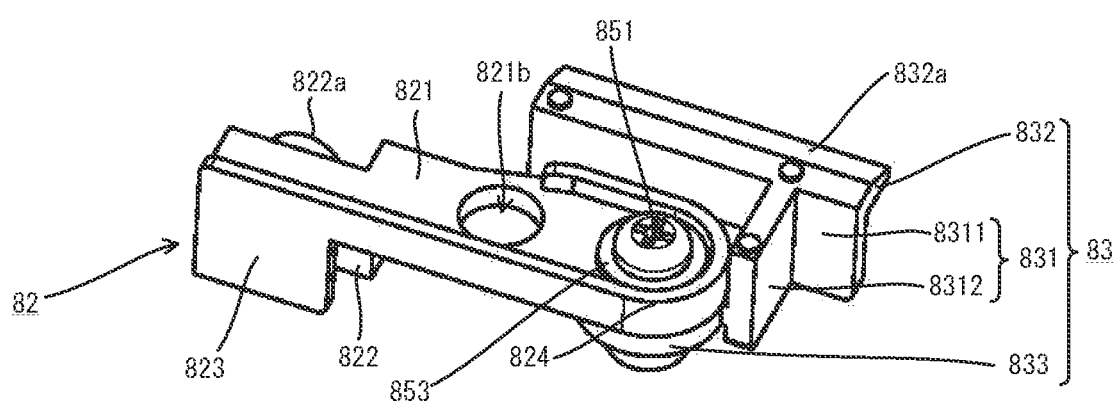
FIG. 6C is a perspective view of the arm and the locking member in Embodiment 1.

With the rail mount 10e receiving the DIN rail RA, as shown in FIG. 3, the locking member 83 may be at a locking position to lock the engagement flange RAb on the edge of the DIN rail RA in +X-direction, and at a release position to unlock the engagement flange RAb. As shown in FIGS. 6A to 6C, the locking member 83 includes a body 831, an engagement portion 832, and a connection portion 833. The body 831 includes a main section 8311 that is a rectangular plate, and a reinforcement section 8312 that is a rectangular plate and extending from the main section 8311 in the direction opposite to the extending direction of the engagement portion 832. The engagement portion 832 extends in the thickness direction of the main section 8311 from the entire length of one lateral edge of the main section 8311 of the body 831. The engagement portion 832 has a beveled surface 832a sloping toward the distal end of the engagement portion 832 away from the lateral edge of the main section 8311. The connection portion 833 includes a coupling section 8331 with the periphery continuous with the main section 8311 and the reinforcement section 8312 of the body 831, and with a threaded hole 833a extending through the center of the coupling section 8331. The connection portion 833 also includes an annular projection 8332 protruding from the outer periphery of the threaded hole 833a in the coupling section 8331 and extending in the thickness direction of the coupling section 8331.

Figure 7A:
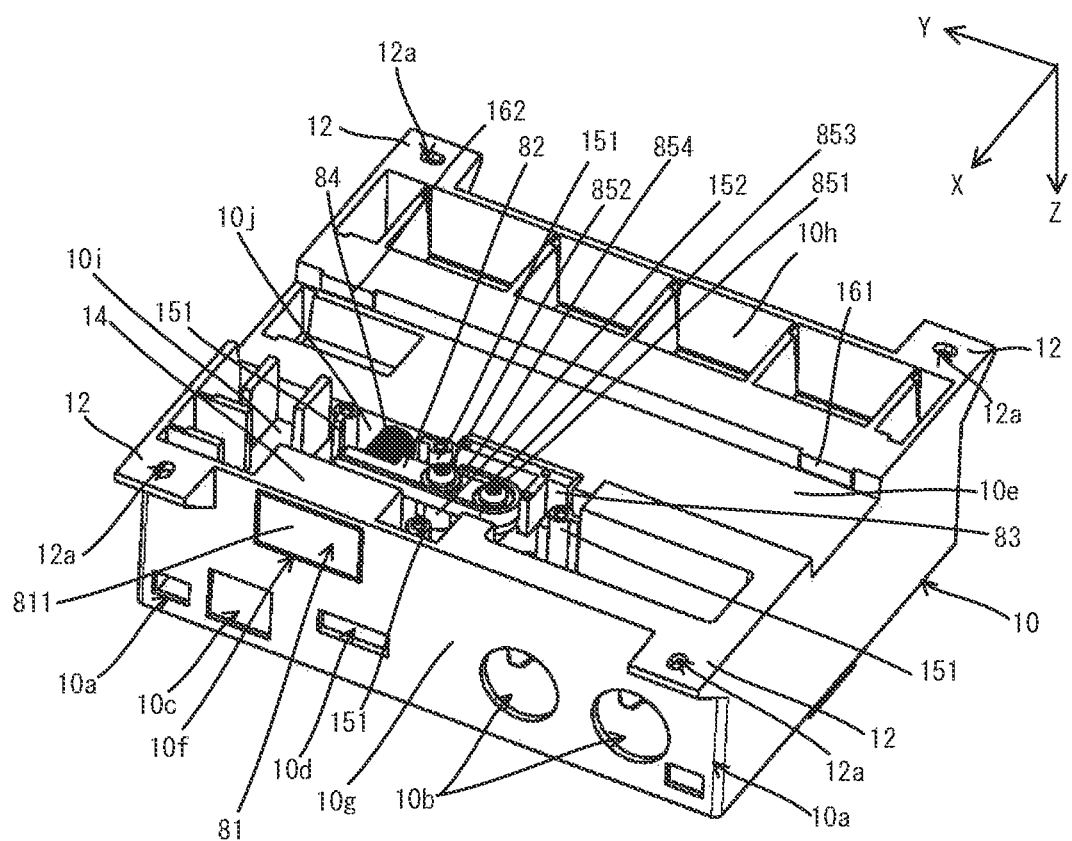
FIG. 7A is a partial perspective view of the device according to Embodiment 1.
Figure 7B:
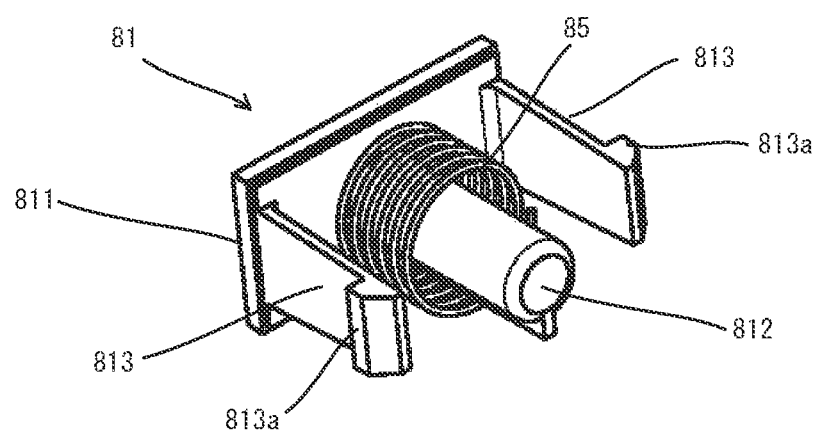
FIG. 7B is a perspective view of a release button and a coil spring in Embodiment 1.

As shown in FIG. 7A, the release button 81 is located in the housing 10 with the pressing portion 811 exposed outside the housing 10. The pressing portion 811 is to be pressed by a user to move the locking member 83 to the release position. As shown in FIG. 7B, the release button 81 includes the pressing portion 811 that is a rectangular plate, a columnar protrusion 812 at the center of the pressing portion 811, and protruding sections 813 extending in the same direction as the protrusion 812 from the two longitudinal ends of the pressing portion 811. Each protruding section 813 has a hook 813a at the distal end. The protrusion 812 receives a coil spring 85. The release button 81 is fitted in the tubular portion 14 shown in FIG. 5B. In this state, the projection 142c on the bottom wall 142 of the tubular portion 14 is fitted inside the coil spring 85. The distal end of the protrusion 812 is placed into the through-hole 142a in the bottom wall 142, and the hooks 813a at the distal ends of the protruding sections 813 are placed into the through-holes 142b in the bottom wall 142. The coil spring 85 is compressed from the natural length and placed between the pressing portion 811 and the bottom wall 142 while urging the pressing portion 811 in +X-direction. The hooks 813a on the protruding sections 813 are held on the outer peripheries of the through-holes 142b in the bottom wall 142 to restrict movement of the release button 81 in +X-direction. The release button 81 is movable between a predetermined standby position and a pressed position deeper in the housing 10 than the standby position. With the release button 81 at the standby position, the pressing surface of the pressing portion 811 is flush with the outer periphery of the opening 10f in the outer wall of the housing 10. In this state, the pressing surface of the pressing portion 811 appears smoothly continuous with the outer periphery of the opening 10f in the outer wall of the housing 10, and thus the device 1 may have a higher design quality. As viewed in +X-direction, the release button 81 is at a position shifted in −Y-direction from the locking member 83.

The arm 82 is a driver that moves the locking member 83 from the locking position to the release position in response to movement, by a press of the pressing portion 811 of the release button 81, of the release button 81 from the standby position to the pressed position. As shown in FIG. 3, the arm 82 is elongated and has an end 82a that is one longitudinal end connected to the locking member 83, and an end 82b that is the other end moved by the release button 81. As shown in FIG. 6A, the arm 82 includes a main section 821 that is an elongated plate with through-holes 821a and 821b that are circular in a plan view at one longitudinal end and the center of the main section 821. The arm 82 also includes, at the other end of the main section 821, extensions 822 and 823 that are rectangular plates and extending in the thickness direction of the main section 821 from the two lateral edges. The main section 821 includes a peripheral reinforcement rib 824 protruding in a direction opposite to the extending direction of the extensions 822 and 823. Additionally, the extension 822 has an annular projection 822a protruding in a direction opposite to the extension 823. As indicated by arrow AR11 in FIG. 6A and also shown in FIG. 6B, the projection 8332 on the connection portion 833 of the locking member 83 is fitted in the through-hole 821a in the main section 821 of the arm 82. As shown in FIG. 6C, the locking member 83 in this state is connected to the arm 82 with a screw 851 screwed into the threaded hole 833a in the connection portion 833 with a washer 853 in between.

Figure 8:
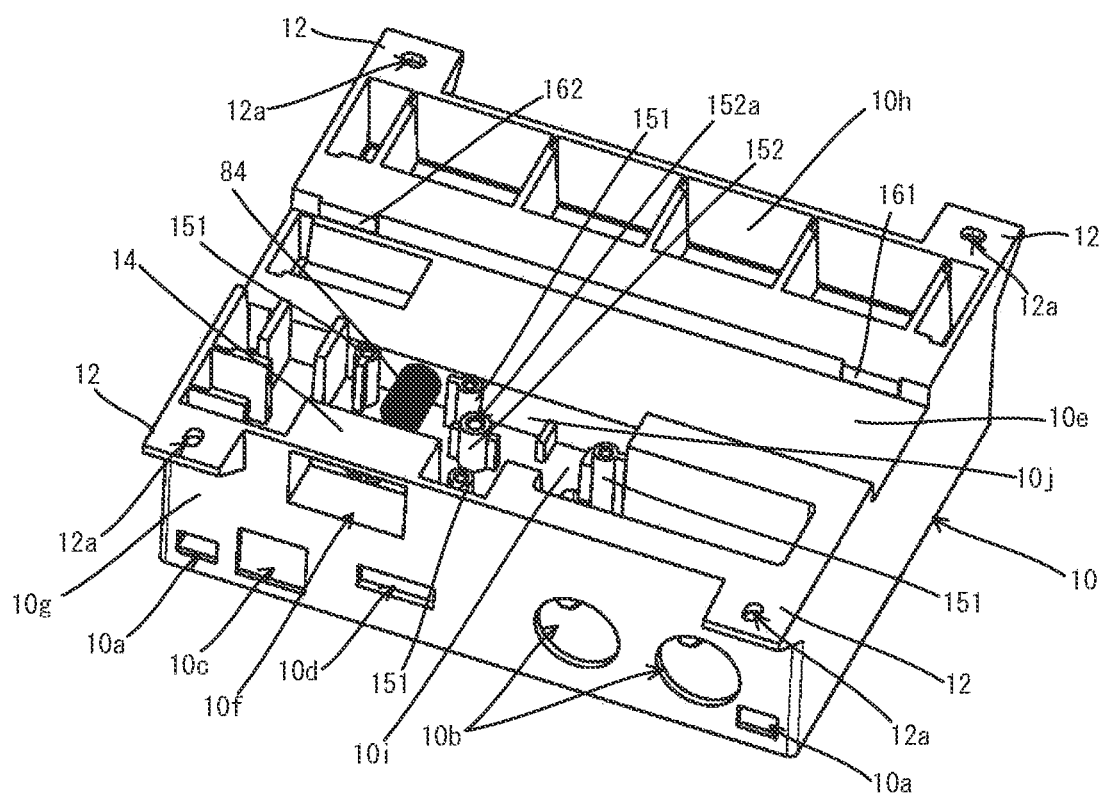
FIG. 8 is a partial perspective view of the device according to Embodiment 1.
Figure 9A:
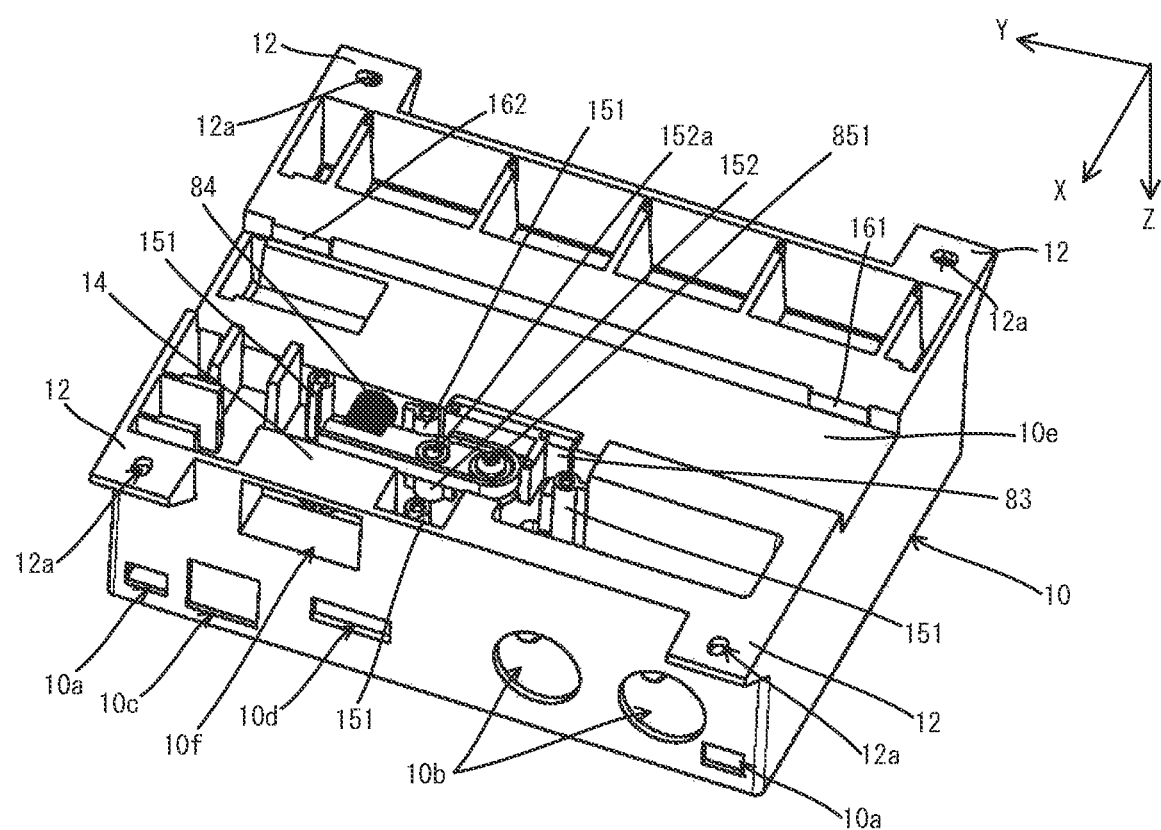
FIG. 9A is a partial perspective view of the device according to Embodiment 1.
Figure 9B:
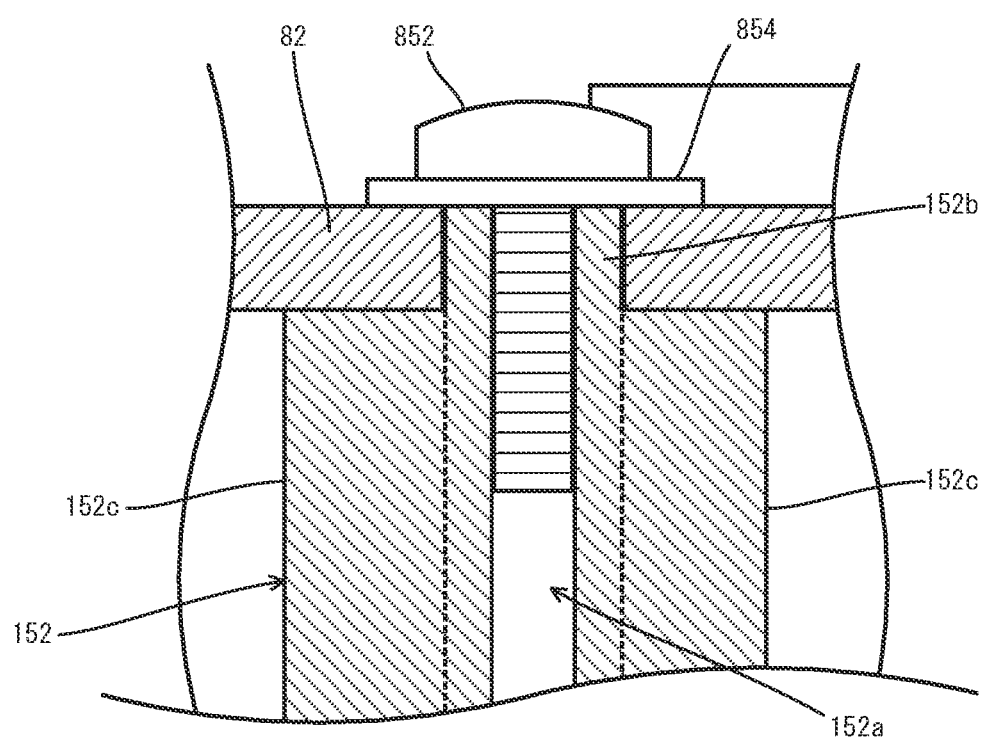
FIG. 9B is a cross-sectional view of the arm in Embodiment 1.
Figure 10:
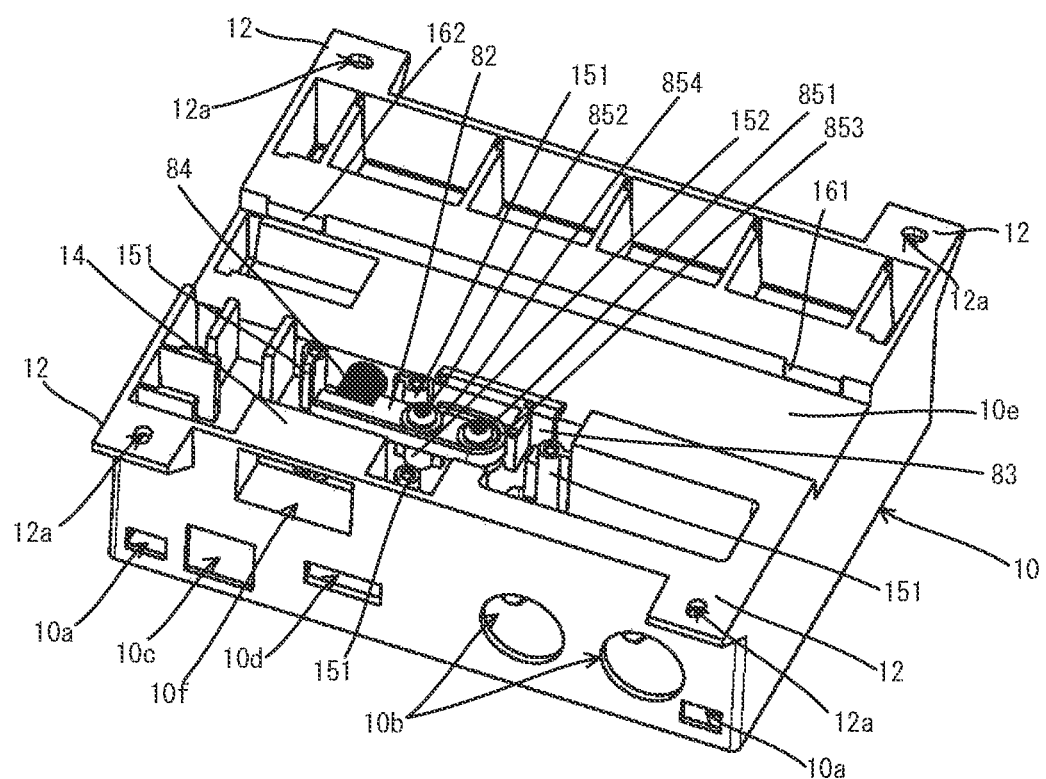
FIG. 10 is a partial perspective view of the device according to Embodiment 1.

The coil spring 84 is placed with the projection 153 on the housing 10 fitted inside one end of the coil spring 84. When the locking member 83 is at the locking position, the coil spring 84 is in the natural length. With the coil spring 84 placed in the housing 10 as shown in FIG. 8, the arm 82 is mounted on the distal end of the support rib 152 as shown in FIG. 9A. In this state, as shown in FIG. 9B, the distal end of the rib body 152b of the support rib 152 is fitted inside the through-hole 821b in the main section 821 of the arm 82. The projection 822a on the extension 822 of the arm 82 is fitted inside the other end of the coil spring 84. As shown in FIG. 10, a screw 852 is screwed into the threaded hole 152a in the support rib 152 with a washer 854 in between to attach the arm 82 to the distal end of the support rib 152. In this state, as shown in FIG. 9B, the arm 82 is supported rotatably between the washer 854 and the distal end of the blade 152c on the support rib 152. The arm 82 is also urged by the coil spring 84 to rotate to move the locking member 83 to the locking position.

Figure 11A:
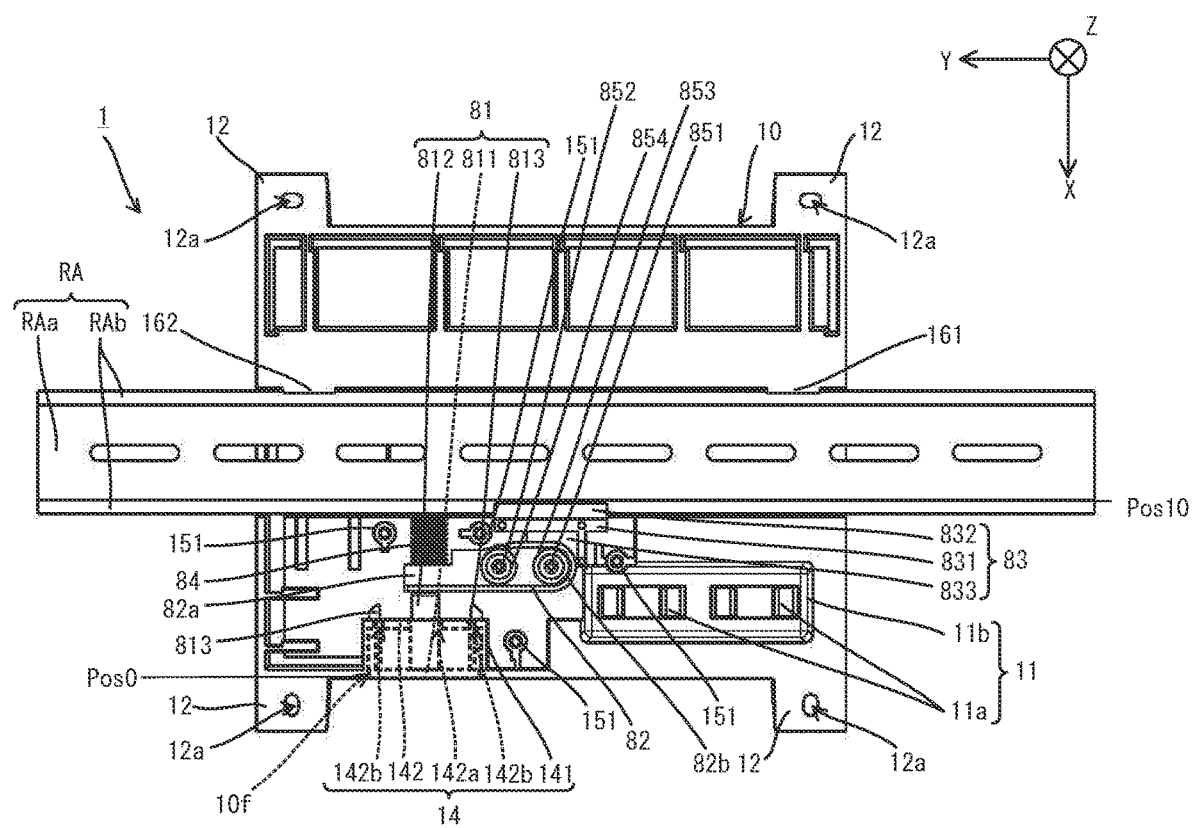
FIG. 11A is a bottom view of the device according to Embodiment 1.
Figure 11B:
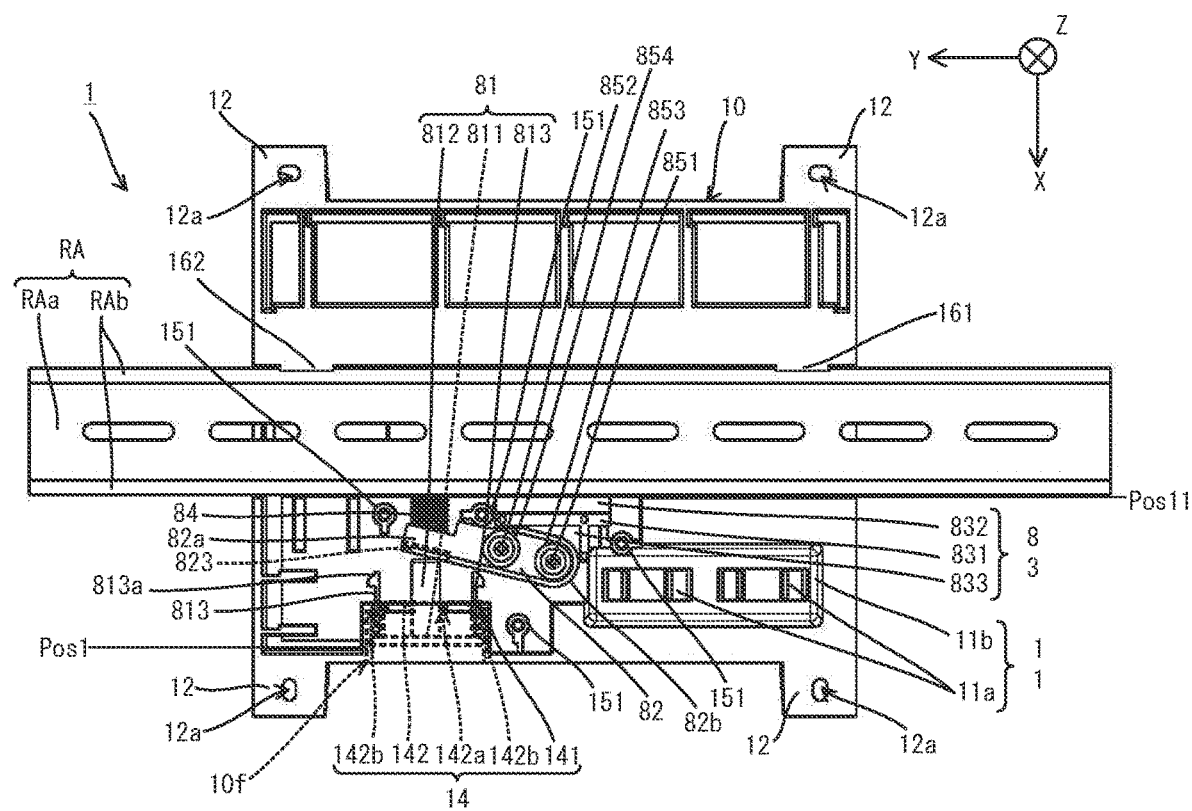
FIG. 11B is a bottom view of the device according to Embodiment 1.

A method of attaching and detaching the device 1 according to the present embodiment to and from the DIN rail RA will now be described with reference to FIGS. 11A and 11B. With the device 1 attached to the DIN rail RA, as shown in FIG. 11A, the engagement portion 832 of the locking member 83 is at a locking position Pos10 for locking the engagement flange RAb on the DIN rail RA. In this state, as shown in FIG. 11B, when the pressing portion 811 is pressed to move the release button 81 in −X-direction from a standby position Pos0, the distal end of the protrusion 812 on the release button 81 comes into contact with the extension 823 on the arm 82 and pushes the extension 823 in −X-direction. As the end 82b of the arm 82 moves in −X-direction, the arm 82 rotates about the area supported by the washer 854 and the support rib 152. The end 82a of the arm 82 moves in +X-direction accordingly, and the locking member 83 connected to the end 82a of the arm 82 moves in +X-direction. When the release button 81 moves to a pressed position Pos1, the locking member 83 is at a release position Pos11. In this state, the engagement flange RAb on the DIN rail RA in +X-direction may be disengaged from the rail mount 10e to detach the device 1 from the DIN rail RA.

To attach the device 1 to the DIN rail RA, the pressing portion 811 of the release button 81 is first pressed as shown in FIG. 11B. With the release button 81 at the pressed position Pos1, the DIN rail RA is placed onto the rail mount 10e to engage the engagement flange RAb on the DIN rail RA in −X-direction into the stoppers 161 and 162 on the housing 10. The release button 81 is then released, and as the restoring force of the coil spring 84 moves the end 82b of the arm 82 in +X-direction, the arm 82 rotates about the area supported by the washer 854 and the support rib 152. The end 82a of the arm 82 moves in −X-direction accordingly, and the locking member 83 connected to the end 82a of the arm 82 also moves in −X-direction. When the release button 81 is at the standby position Pos0, the locking member 83 is at the locking position Pos10. In this manner, the device 1 is attached to the DIN rail RA.

In the device 1 according to the present embodiment, as described above, the locking member 83 may be at the locking position Pos10 to lock the engagement flange RAb on the DIN rail RA, and the release position Pos11 to unlock the engagement flange RAb with the rail mount 10e receiving the DIN rail RA. The release button 81 is placed in the housing 10 with the pressing portion 811 exposed outside the housing 10. In response to movement, by the press of the pressing portion 811, of the release button 81 from the standby position Pos0 to the pressed position Pos1, the arm 82 moves the locking member 83 from the locking position Pos10 to the release position Pos11. In this manner, a user can move the locking member 83 from the locking position Pos10 to the release position Pos11 simply by pressing the pressing portion 811 of the release button 81 to move the release button 81 from the standby position Pos0 to the pressed position Pos1. This structure improves the workability of attaching and detaching the device 1 to and from the DIN rail RA. For the device 1 attached to the DIN rail RA with the pressing portion 811 positioned in the vertically lower portion of the device 1, the user can easily detach the device 1 from the DIN rail RA simply by pressing the pressing portion 811 from vertically below the device 1 with the user's finger. The device 1 may thus be easily attachable to or detachable from the DIN rail RA.

With the rail mount 10e of the housing 10 receiving the DIN rail RA, the locking member 83 in the present embodiment is positioned to lock the engagement flange RAb on the DIN rail RA at the center of the rail mount 10e in Y-direction. This structure reduces the imbalance in the locked position of the device 1 in Y-direction on the DIN rail RA, thus enabling firm and balanced attachment of the device 1 to the DIN rail RA.

The arm 82 in the present embodiment includes the extension 823 having the longitudinal end 82a connected to the locking member 83, and the other end 82b pressed by the distal end of the protrusion 812 on the release button 81. The housing 10 includes the support rib 152 that pivotally supports the central portion of the arm 82. As viewed in +X-direction, the release button 81 is at a position shifted in −Y-direction from the locking member 83. This structure allows the position of the release button 81 in Y-direction to be changed by adjusting the length of the arm 82, thus improving the design flexibility in positioning the release button 81. In particular, with the release button 81 in the +Y-direction of the center of the device 1, the user will easily press the pressing portion 811 of the release button 81 with the user's thumb while holding the device 1. This improves the workability of attaching and detaching the device 1 to and from the DIN rail RA. The housing 10 includes the tubular portion 14 as a closed-bottomed square tube with the tube axis aligned with the X axis, and the tubular portion 14 receives the release button 81 that is movable inside in X-direction. This structure enables the smooth movement of the release button 81 in X-direction, thus improving the ease of pressing the pressing portion 811 of the release button 81.

Embodiment 2

A device according to the present embodiment is, similarly to the device 1 according to Embodiment 1, a controller attached to a DIN rail and connected to a target device to be operated such as an air conditioner (not shown) with a signal line. The device according to the present embodiment differs from the device 1 according to Embodiment 1 in the position of the release button and the structure of the driver.

Figure 12:
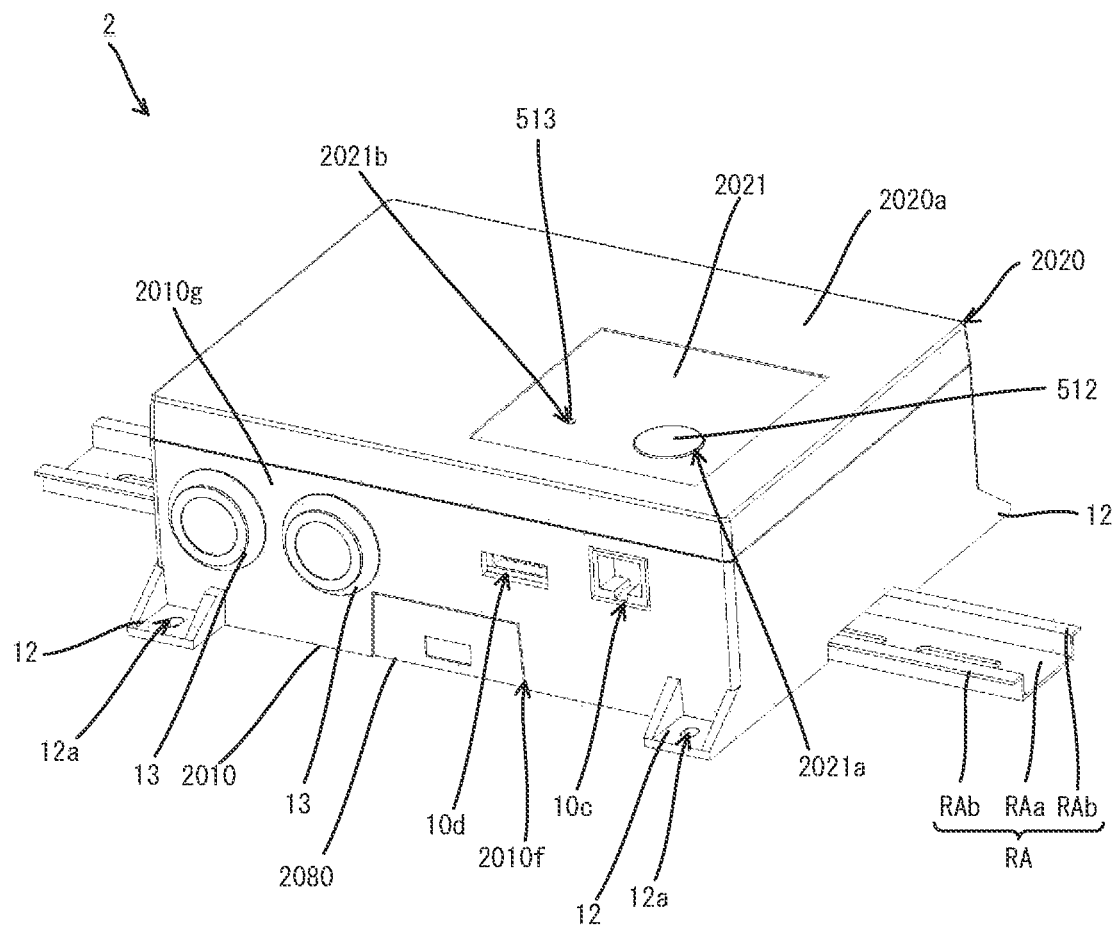
FIG. 12 is a perspective view of a device according to Embodiment 2 of the present disclosure.
Figure 13A:
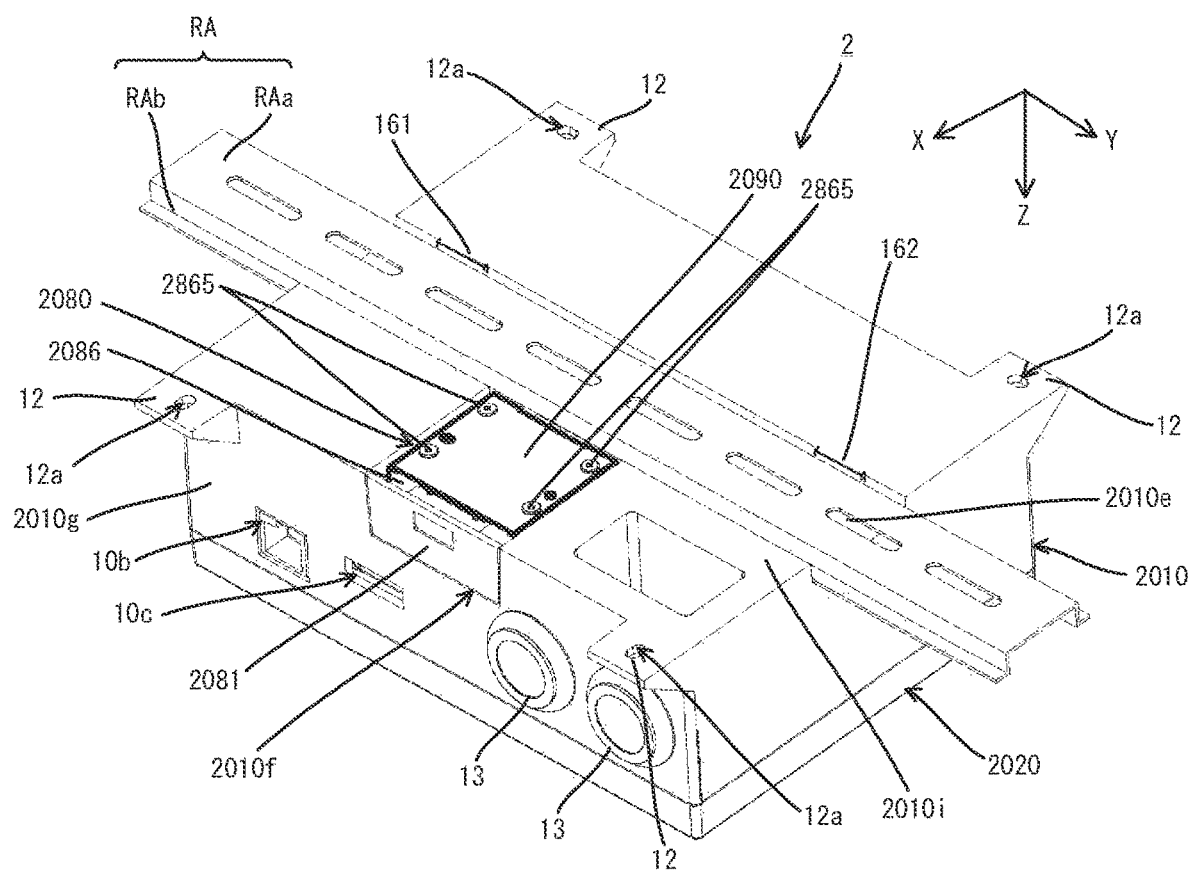
FIG. 13A is a perspective view of the device according to Embodiment 2.

As shown in FIGS. 12 and 13A, a device 2 includes a housing 2010 attachable to a DIN rail RA, a front cover 2020 attached to the housing 2010 to cover the front of the housing 2010, and a control board (not shown) that outputs control signals to an air conditioner. The device 2 also includes a rail attachment assembly 2080 through which the device 2 is attached to the DIN rail RA. In FIGS. 12 and 13A, the components that are also described in Embodiment 1 are given the same reference numerals as in FIGS. 1 and 3.

Figure 13B:
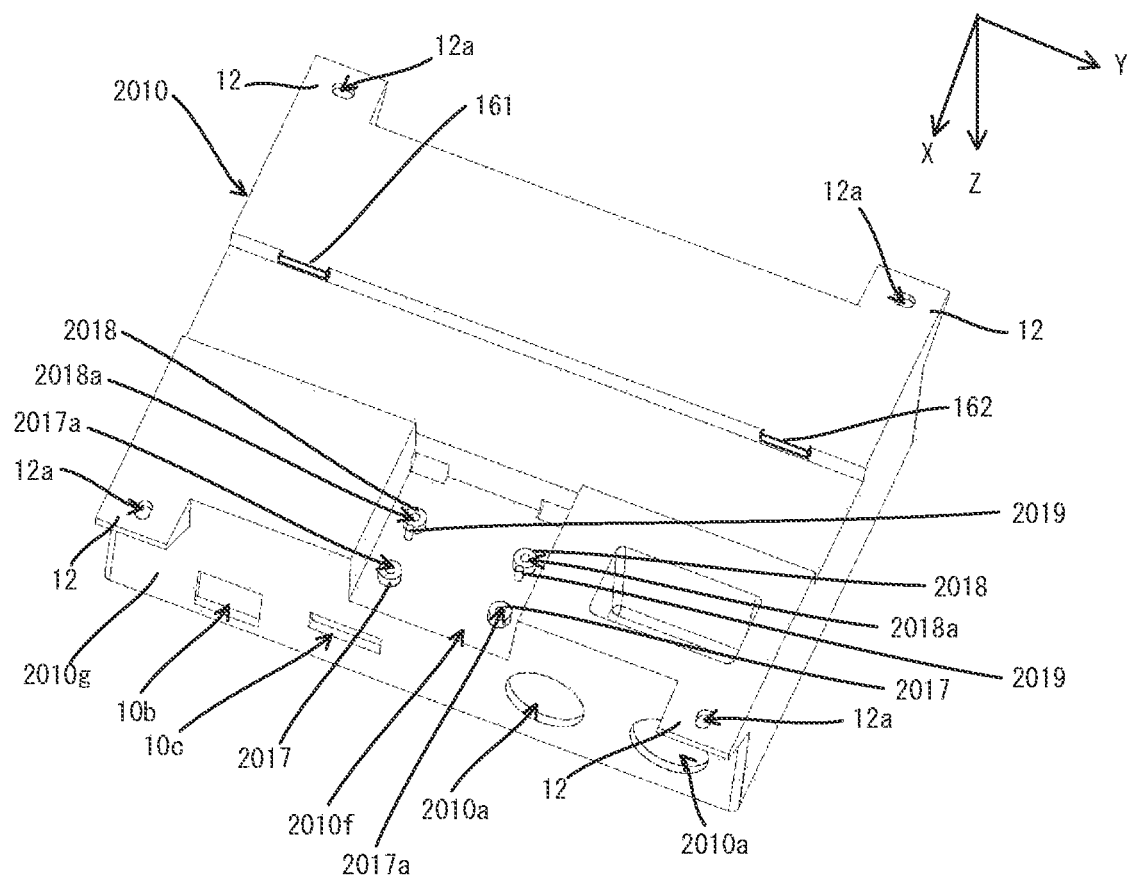
FIG. 13B is a perspective view of a housing in Embodiment 2.

The housing 2010 is a rectangular box with one face open, and accommodates a display board 50 and a control board 40. Similarly to the housing 10 in Embodiment 1, the housing 10 has, in a side wall 2010g in +X-direction, two through-holes (not shown) that are circular in a plan view for leading a power cable and a signal cable into the housing 2010, a through-hole 10c that is rectangular in a plan view for receiving a LAN connector, and a through-hole 10d that is rectangular in a plan view for receiving a USB connector. The housing 2010 also has, in −Z-direction, an assembly fixing groove 2010f for receiving the rail attachment assembly 2080 to be fixed. As shown in FIG. 13B, the assembly fixing groove 2010f has columnar ribs 2017 and 2018 with threaded holes 2017a and 2018a in the distal ends, and columnar projections 2019. The two through-holes for leading the power cable and the signal cable into the housing 2010 receive grommets 13 as in Embodiment 1. The housing 2010 includes a bottom wall 2010i having, in −Z-direction, a rail mount 2010e to receive the DIN rail RA is placed with the length of the DIN rail RA aligned with the Y axis, and two stoppers 161 and 162.

As shown in FIG. 12, the front cover 2020 is a flat rectangular box with an open face in −Z-direction, and includes a bottom wall 2020a as a rectangular plate. The bottom wall 2020a has a through-hole (not shown) that receives a power button 512, and a through-hole (not shown) that receives a reset button 513. The bottom wall 2020a also has a translucent sheet 2021 in a front surface area including the power button 512 and the reset button 513. The sheet 2021 has openings 2021a and 2021b that receive the power button 512 and the reset button 513 at the positions corresponding to the power button 512 and the reset button 513.

Figure 14:
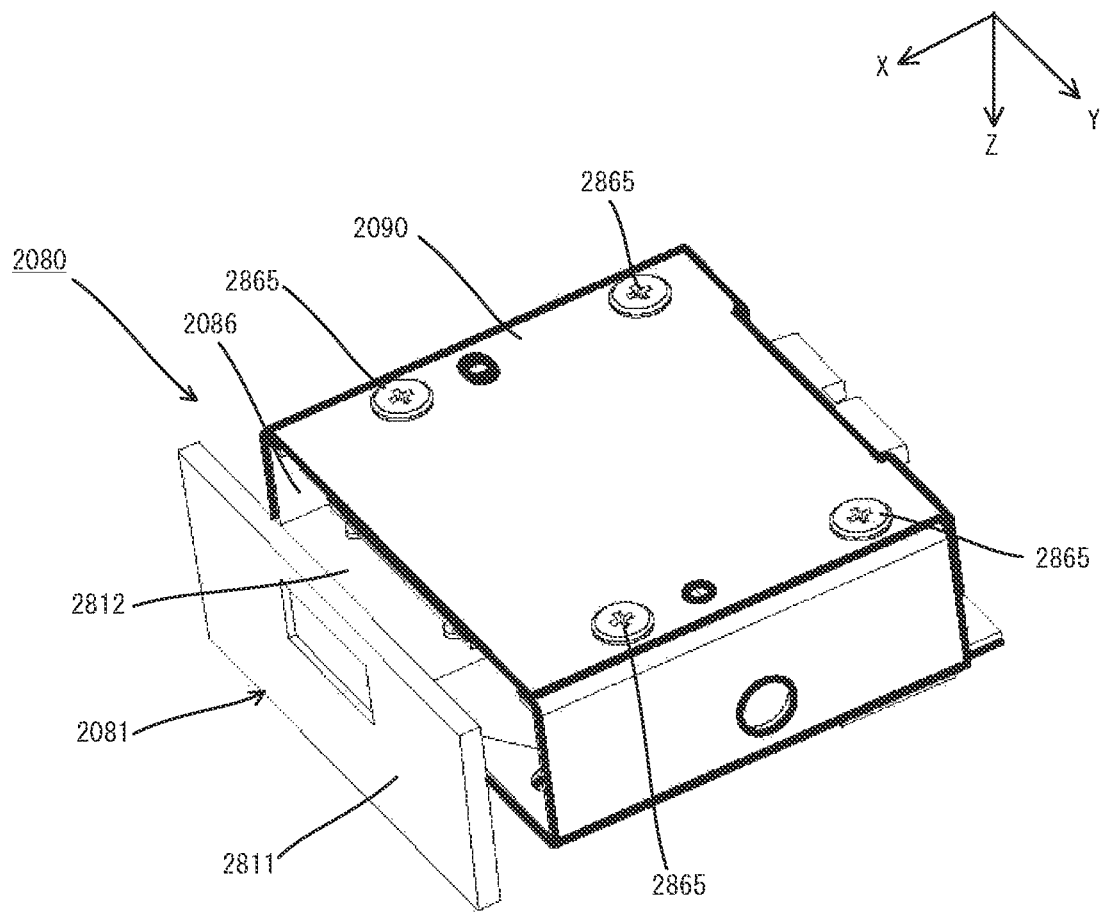
FIG. 14 is a perspective view of a rail attachment assembly in Embodiment 2.
Figure 15A:
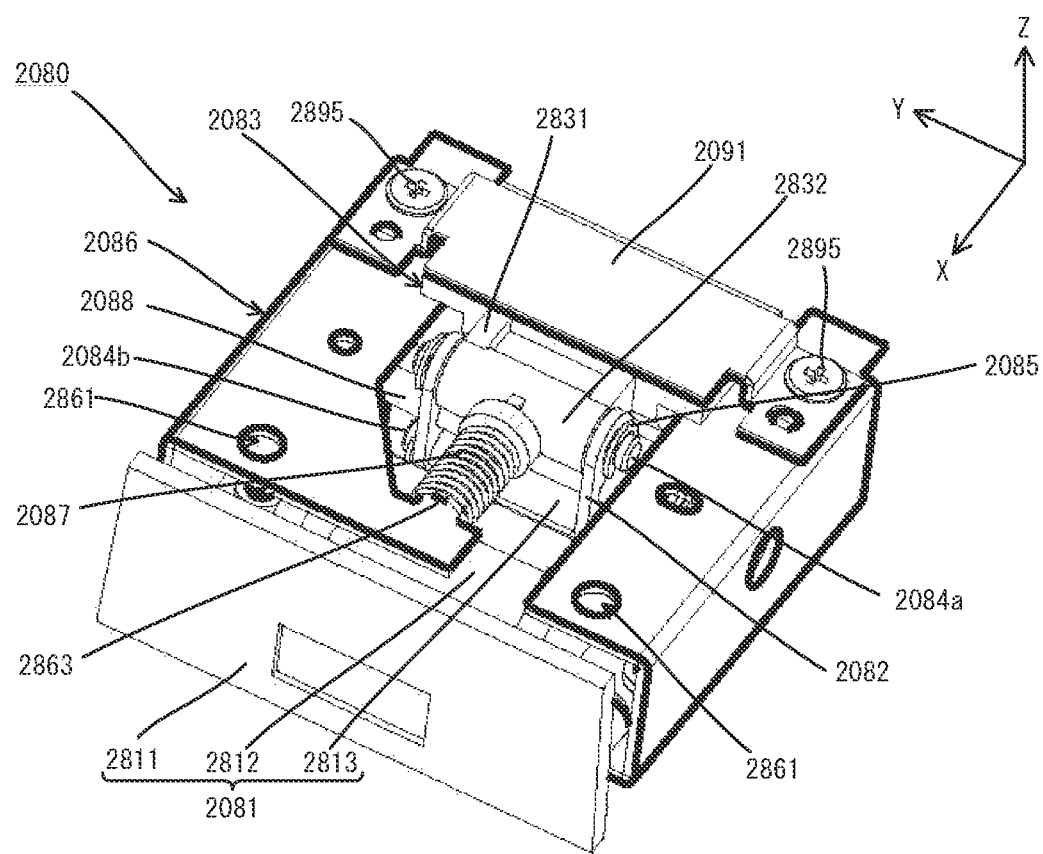
FIG. 15A is a perspective view of the rail attachment assembly in Embodiment 2.
Figure 15B:
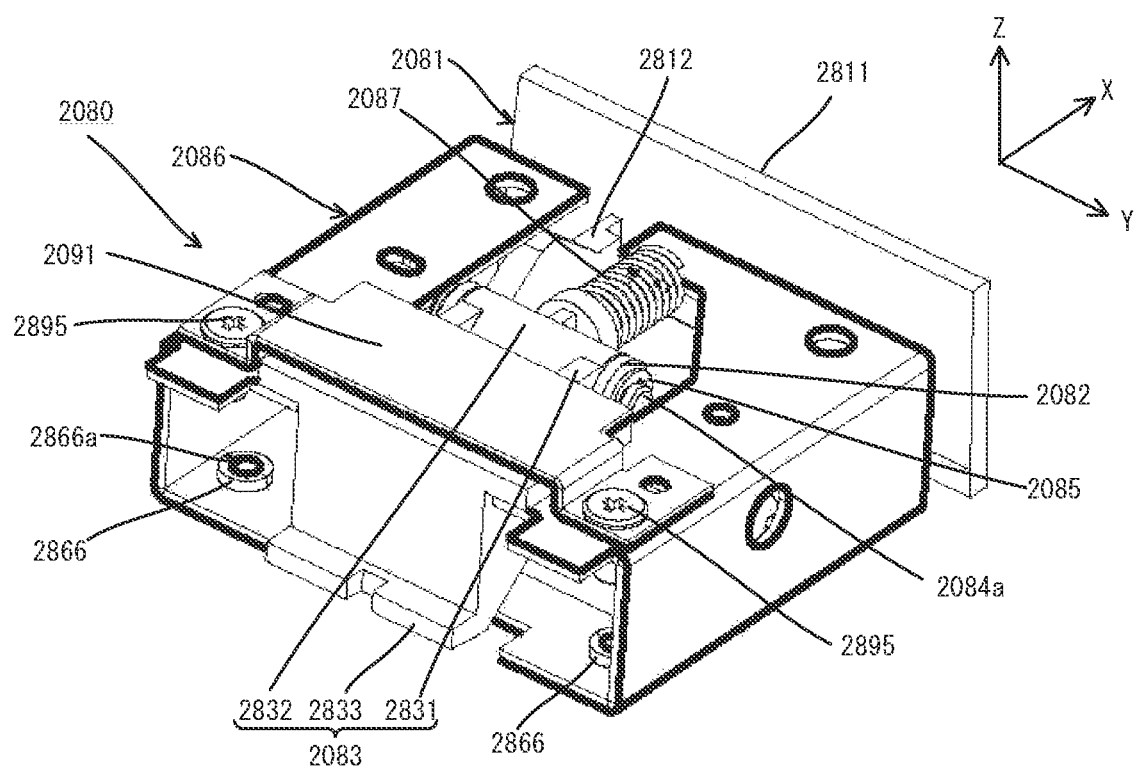
FIG. 15B is a perspective view of the rail attachment assembly in Embodiment 2.

As shown in FIG. 14, the rail attachment assembly 2080 includes a holder 2086, a holder cover 2090, and a release button 2081 that has a pressing portion 2811 to be pressed by a user and is located on the housing 2010 with the pressing portion 2811 exposed outside the housing 2010. The holder cover 2090 is a rectangular plate, and is placed over the end of the holder 2086 in −Z-direction and secured to the holder 2086 with screws 2865. As shown in FIGS. 15A and 15B, the rail attachment assembly 2080 includes a locking member 2083, a connecting member 2082 having two coupling sections 2821 that are elongated and each have one longitudinal end connected to the locking member 2083 and the other end connected to the release button 2081, and a shaft 2088 that is an elongated rod and pivotally supports the central portion of the connecting member 2082. The rail attachment assembly 2080 further includes a coil spring 2087 that urges the locking member 2083 in −X-direction, and an assembly cover 2091 fixed to the holder 2086 to cover the end of the locking member 2083 in +Z-direction. The connecting member 2082 and the shaft 2088 form a driver that moves the locking member 2083 from a locking position to a release position in response to movement, by a press of the pressing portion 2811 of the release button 2081, of the release button 2081 from a standby position to a pressed position.

Figure 16A:
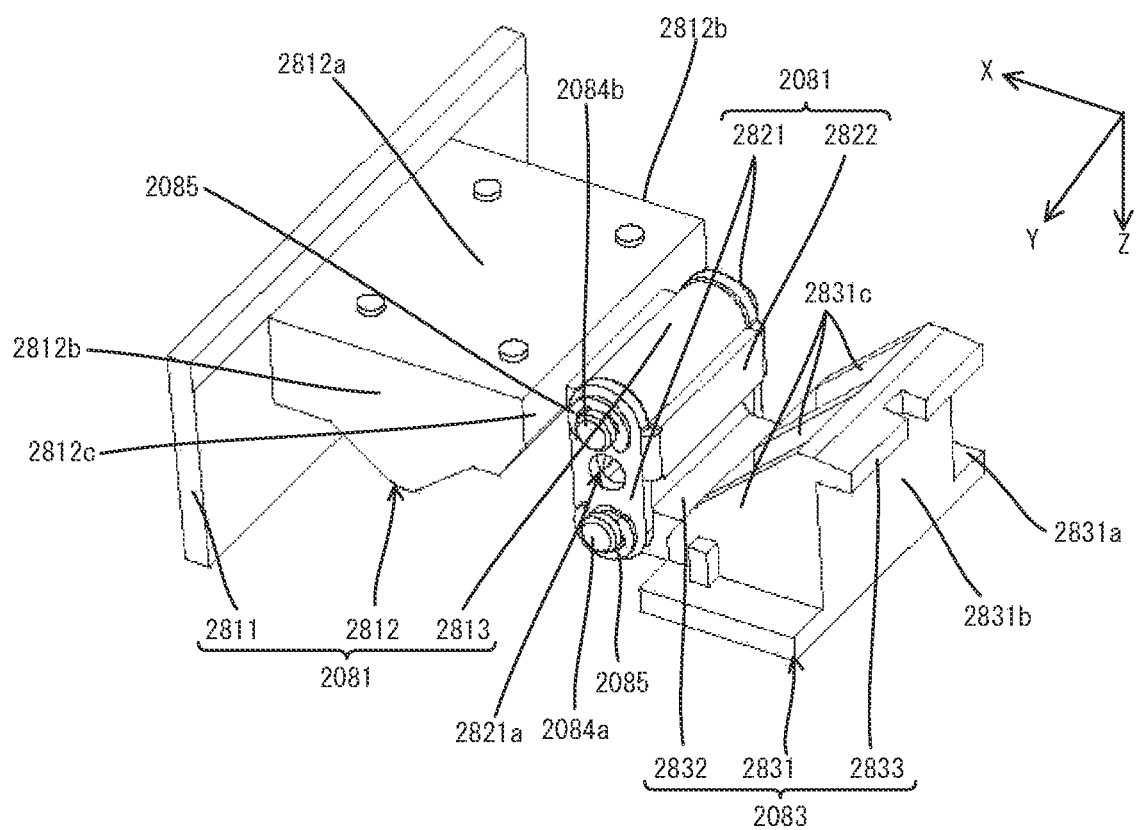
FIG. 16A is a partial perspective view of the rail attachment assembly in Embodiment 2.
Figure 16B:
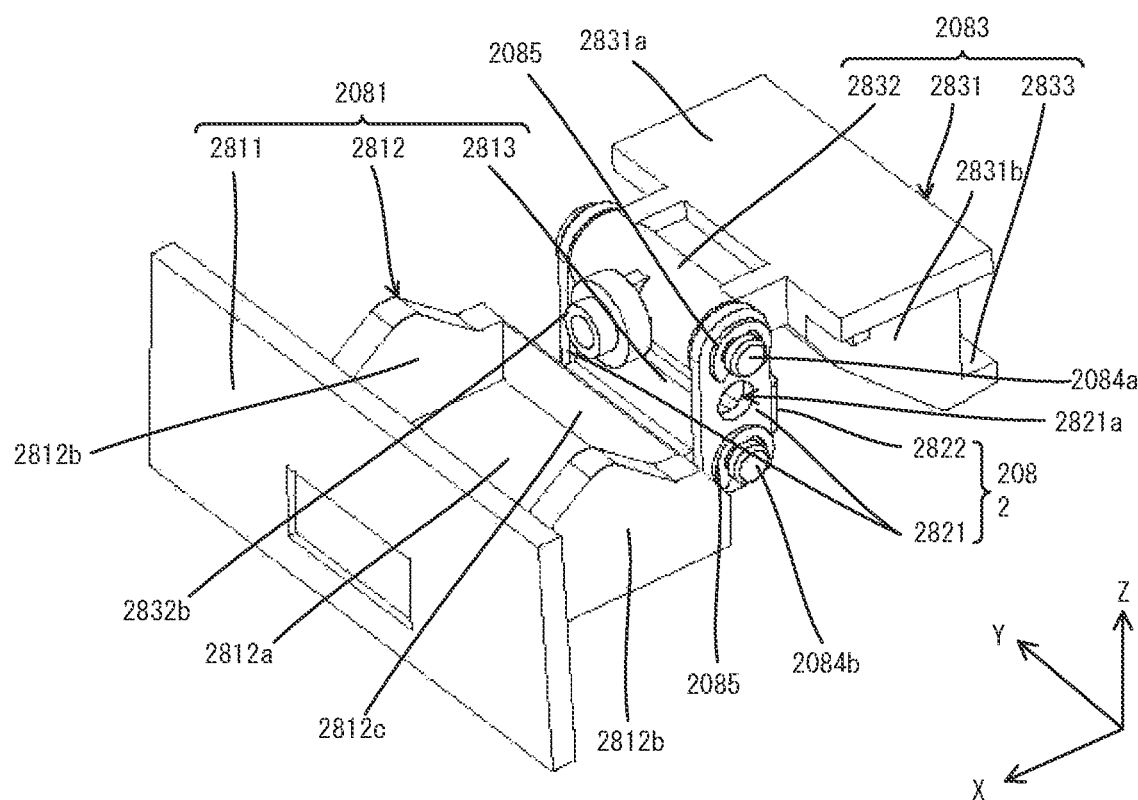
FIG. 16B is a partial perspective view of the rail attachment assembly in Embodiment 2.

As shown in FIGS. 16A and 16B, the locking member 2083 includes a body 2831, an engagement portion 2833, and a connection portion 2832. The body 2831 includes a main section 2831a that is a rectangular plate, an extension 2831b that is a rectangular plate extending in the thickness direction of the main section 2831a from the entire length of one lateral edge of the main section 2831a, and three reinforcement sections 2831c. The three reinforcement sections 2831c each stand in the thickness direction of the extension 2831b, extend in the thickness direction of the main section 2831a, and are continuous with the extension 2831b on one lateral edge of the main section 2831a. The connection portion 2832 is cylindrical and continuous with the other edge of the main section 2831a. The connection portion 2832 has a cylindrical projection 2832b protruding from the axial center of the cylinder in a radial direction of the connection portion 2832. The engagement portion 2833 is continuous with the edge of the extension 2831b of the body 2831 opposite to the main section 2831a and protrudes in the thickness direction of the extension 2831b.

The release button 2081 includes the pressing portion 2811 that is a rectangular plate, a body 2812, and a connection portion 2813. The body 2812 includes a main section 2812a that is a rectangular plate with one lateral edge continuous with the end of the pressing portion 2811 in the thickness direction, two first side sections 2812b, and a second side section 2812c. The two first side sections 2812b extend from the two longitudinal ends of the main section 2812a in the thickness direction of the main section 2812a. The second side section 2812c extends from the other lateral edge of the main section 2812a in the same direction as the first side sections 2812b. The connection portion 2832 is cylindrical and continuous with the second side section 2812c of the body 2812.

The connecting member 2082 includes the two coupling sections 2821 that are elongated plates, and a rectangular connection section 2822 that connects the longitudinal centers of the two coupling sections 2821. The two coupling sections 2821 each have through-holes (not shown) in the two longitudinal ends for receiving shafts 2084a and 2084b, and a through-hole 2821a at the longitudinal center for receiving the shaft 2088. The shaft 2084a inside the connection portion 2832 of the locking member 2083 has portions protruding from the two axial ends of the connection portion 2832 and placed in the corresponding through-holes in the two coupling sections 2821. In this manner, the two coupling sections 2821 are pivotally connected to the locking member 2083 about the shaft 2084a. The shaft 2084a has E-shaped rings 2085 fitted on the two ends. This prevents the shaft 2084a from slipping off the connection portion 2832 of the locking member 2083 and the connecting member 2082. Additionally, the shaft 2084b inside the connection portion 2813 of the release button 2081 has portions protruding from the two axial ends of the connection portion 2813 and placed in the corresponding through-holes in the two coupling sections 2821. In this manner, the two coupling sections 2821 are pivotally connected to the release button 2081 about the shaft 2084b. The shaft 2084b has E-shaped rings 2085 fitted on the two ends. This prevents the shaft 2084b from slipping off the connection portion 2813 of the release button 2081 and the connecting member 2082.

Figure 17A:
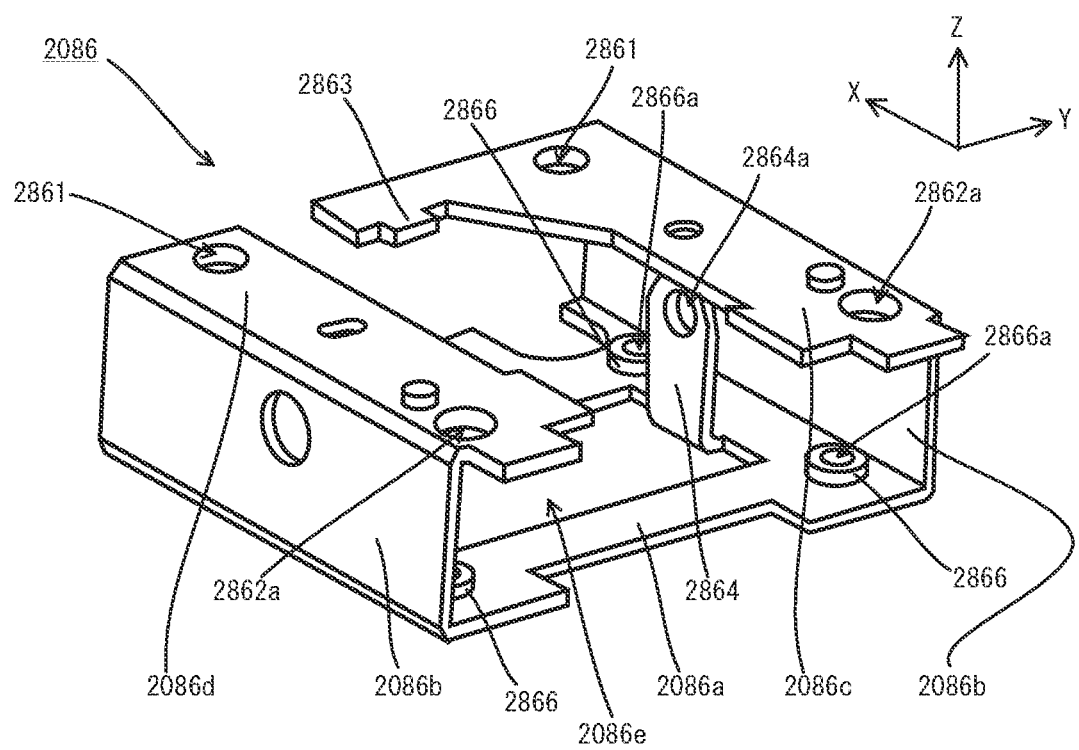
FIG. 17A is a perspective view of a holder in Embodiment 2.
Figure 17B:
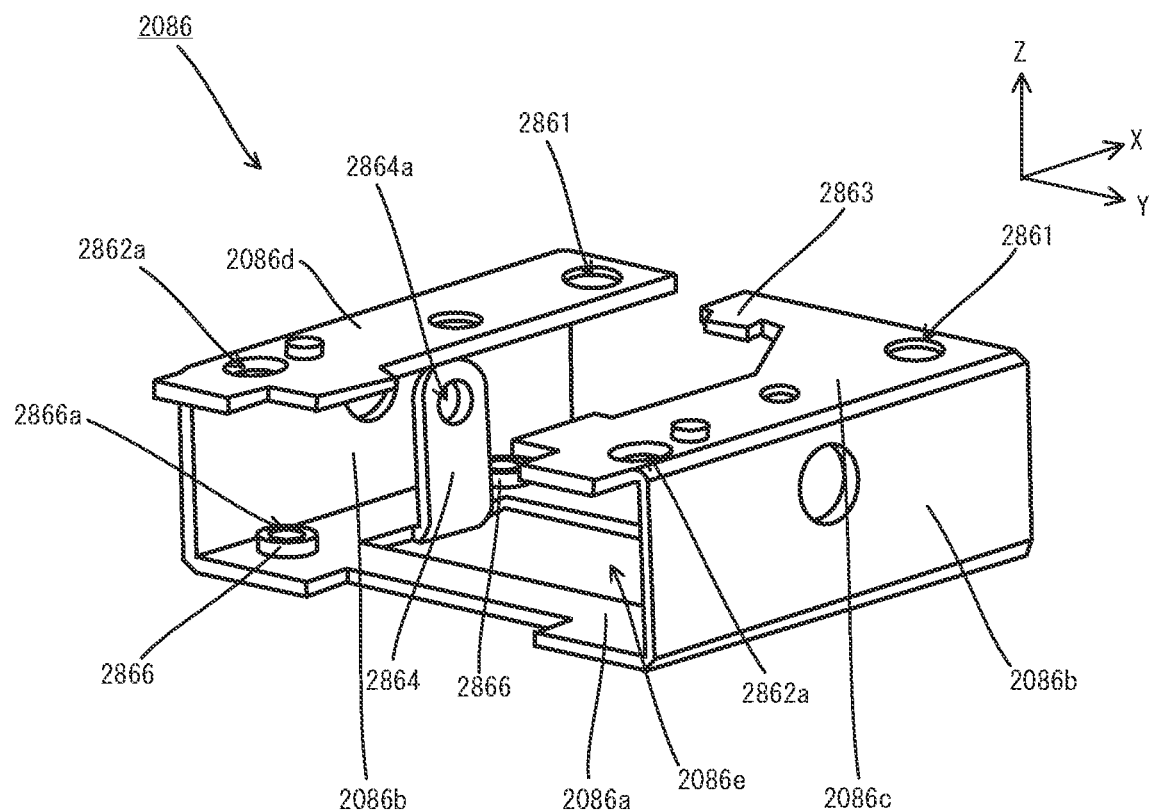
FIG. 17B is a perspective view of the holder in Embodiment 2.
Figure 18:
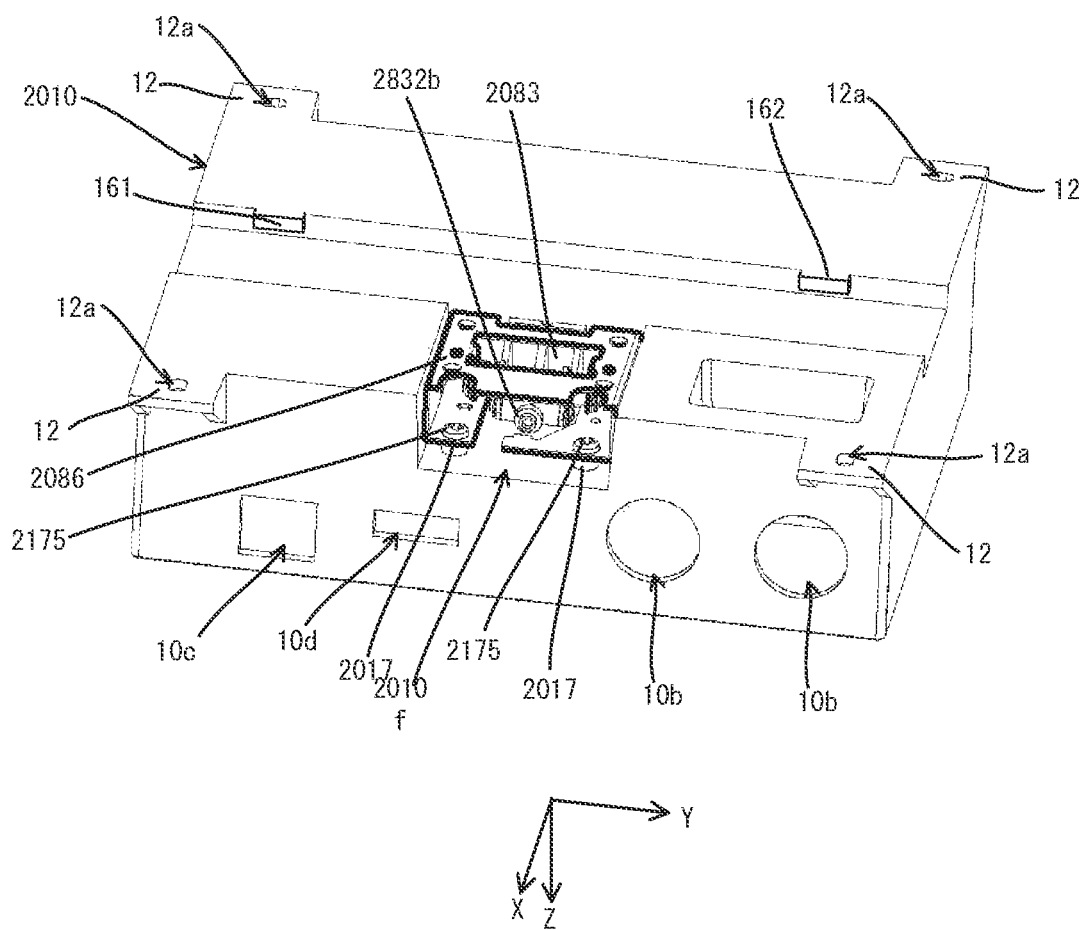
FIG. 18 is a partial perspective view of the device according to Embodiment 2.

As shown in FIGS. 17A and 17B, the holder 2086 includes a main section 2086a that is a rectangular plate having a central opening 2086e, and side sections 2086b extending from the two longitudinal ends of the main section 2086a in the thickness direction of the main section 2086a. The holder 2086 also includes an extension 2086c that is L-shaped in a plan view and an extension 2086d that is a rectangular plate extending toward each other from the edges of the two side sections 2086b opposite to the main section 2086a. The main section 2086a has cylindrical ribs 2866 at four positions in the area surrounding the opening 2086e. Each cylindrical rib 2866 has an internal threaded hole 2866a into which the screw 2865 is screwed for securing the holder cover 2090 to the holder 2086. The main section 2086a also supports sections 2864 at two peripheral positions of the opening 2086e. Each support section 2864 has a through-hole 2864a that receives the corresponding longitudinal end of the shaft 2088. Additionally, the extension 2086c has through-holes 2861 and 2862a that are circular in a plan view in the two end portions in X-direction, and a through-hole 2862b that is circular in a plan view at the center. The extension 2086d has through-holes 2861 and 2862a that are circular in a plan view in the two end portions in X-direction, and a slot 2862c elongated in Y-direction at the center in X-direction. The holder 2086 is placed in the assembly fixing groove 2010f to have the two projections 2019 on the assembly fixing groove 2010f shown in FIG. 13B placed in the through-hole 2862b in the extension 2086c and the slot 2862c in the extension 2086d. In this state, the ribs 2017 on the assembly fixing groove 2010f are placed in the through-holes 2861 in the extensions 2086c and 2086d, whereas the ribs 2018 on the assembly fixing groove 2010f are placed in the through-holes 2862a in the extensions 2086c and 2086d. As shown in FIG. 18, the holder 2086 is secured to the assembly fixing groove 2010f with screws 2175 screwed into the threaded holes 2017a in the ribs 2017. As shown in FIGS. 17A and 17B, the extension 2086c has, at the distal end, a protrusion 2863 extending in −X-direction.

Figure 19A:
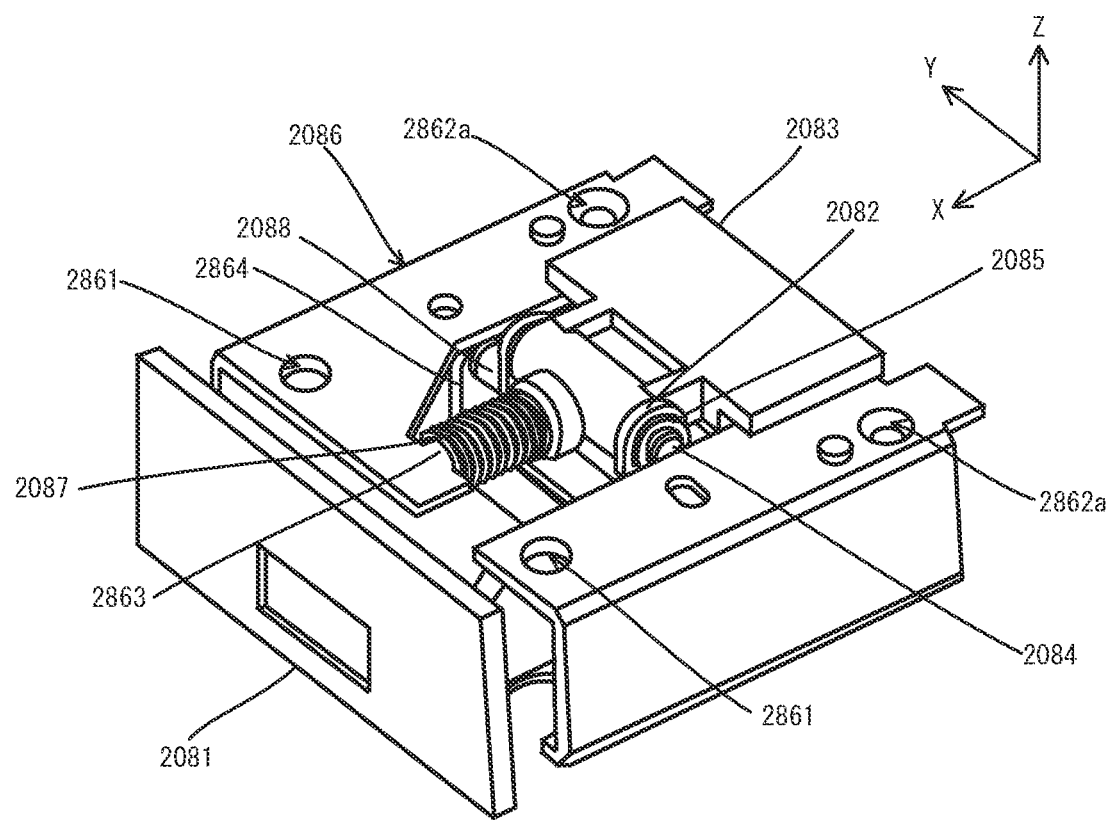
FIG. 19A is a partial perspective view of the rail attachment assembly in Embodiment 2.
Figure 19B:
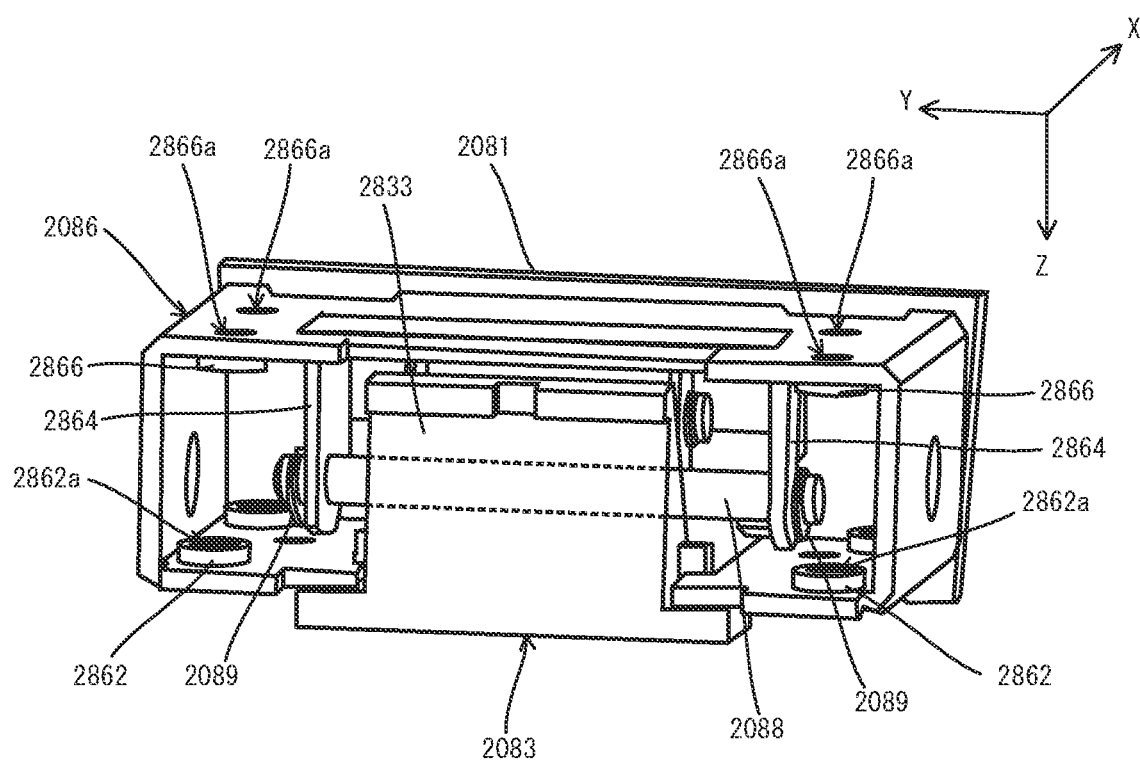
FIG. 19B is a partial perspective view of the rail attachment assembly in Embodiment 2.

As shown in FIG. 19A, one end of the coil spring 2087 is fitted around the projection 2832b on the connection portion 2832 of the locking member 2083 placed inside the holder 2086, and the other end is fitted around the protrusion 2863 on the extension 2086c of the holder 2086. As shown in FIG. 19B, the shaft 2088 is supported by the support sections 2864 with the two longitudinal shaft ends in the through-holes 2864a in the support sections 2864 of the holder 2086. The shaft 2088 receives E-shaped rings 2089 fitted on the portions protruding in the direction opposite to the direction in which the two support sections 2864 face each other. This prevents the shaft 2088 from slipping off the two support sections 2864.

Figure 20A:
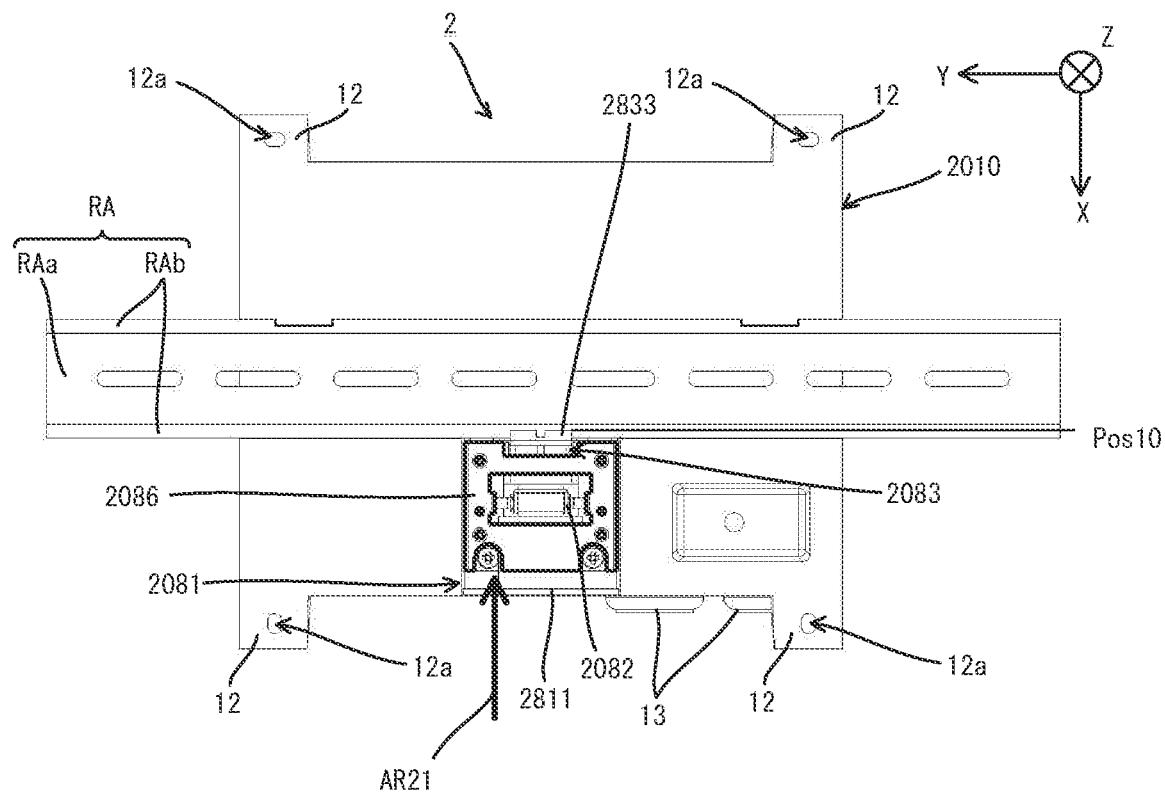
FIG. 20A is a bottom view of the device according to Embodiment 2.

A method of attaching and detaching the device 2 according to the present embodiment to and from the DIN rail RA will now be described with reference to FIGS. 20A to 22B. With the device 2 attached to the DIN rail RA, as shown in FIGS. 20A, 21A, and 22A, the engagement portion 2833 of the locking member 2083 is at a locking position Pos10 for locking an engagement flange RAb on the DIN rail RA. As indicated by arrow AR21 in FIG. 21A, when the pressing portion 2811 is pressed to move the release button 2081 in −X-direction from a standby position Pos0 in this state, an end 2082a of the connecting member 2082 connected to the connection portion 2813 of the release button 2081 is pushed in −X-direction. As the end 2082a of the connecting member 2082 moves in −X-direction, the connecting member 2082 rotates about the shaft 2088. Another end 2082b of the connecting member 2082 moves in +X-direction accordingly. As shown in FIG. 21B, when the release button 2081 moves to a pressed position Pos1, the locking member 2083 connected to the end 2082b of the connecting member 2082 moves in +X-direction to a release position Pos11. In this state, the engagement flange RAb on the DIN rail RA in +X-direction may be disengaged from the rail mount 2010e to detach the device 2 from the DIN rail RA.

Figure 20B:
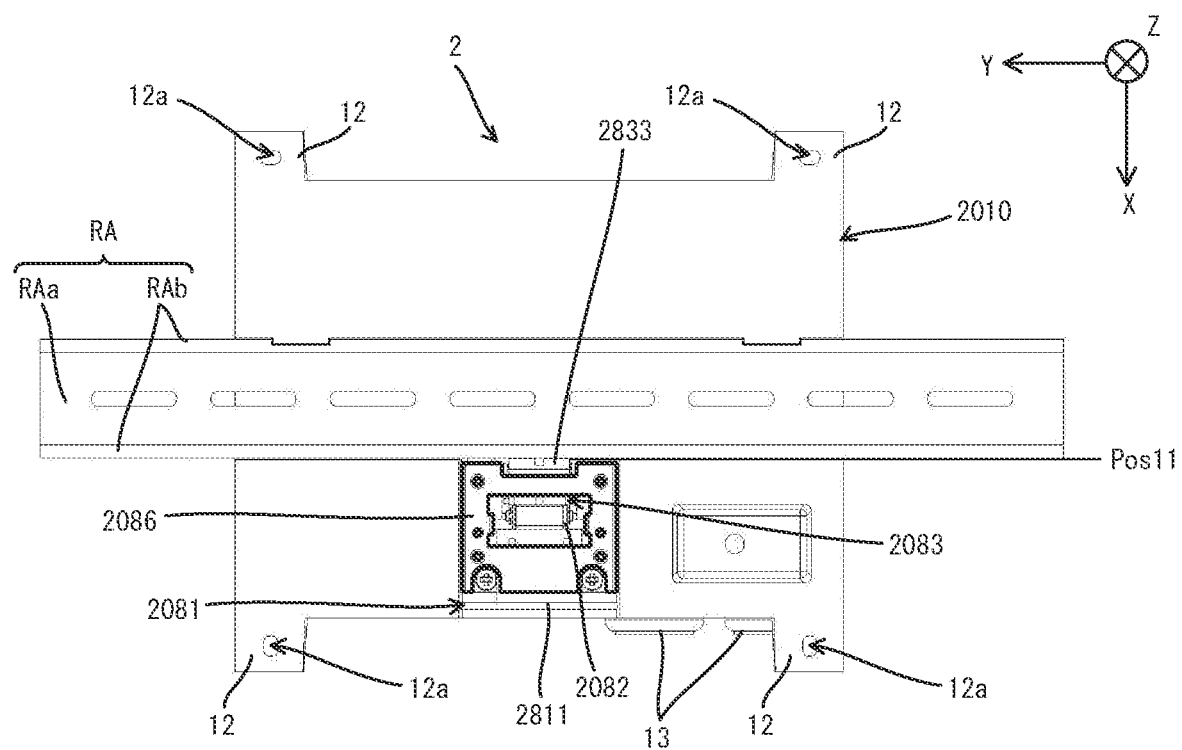
FIG. 20B is a bottom view of the device according to Embodiment 2.
Figure 21A:
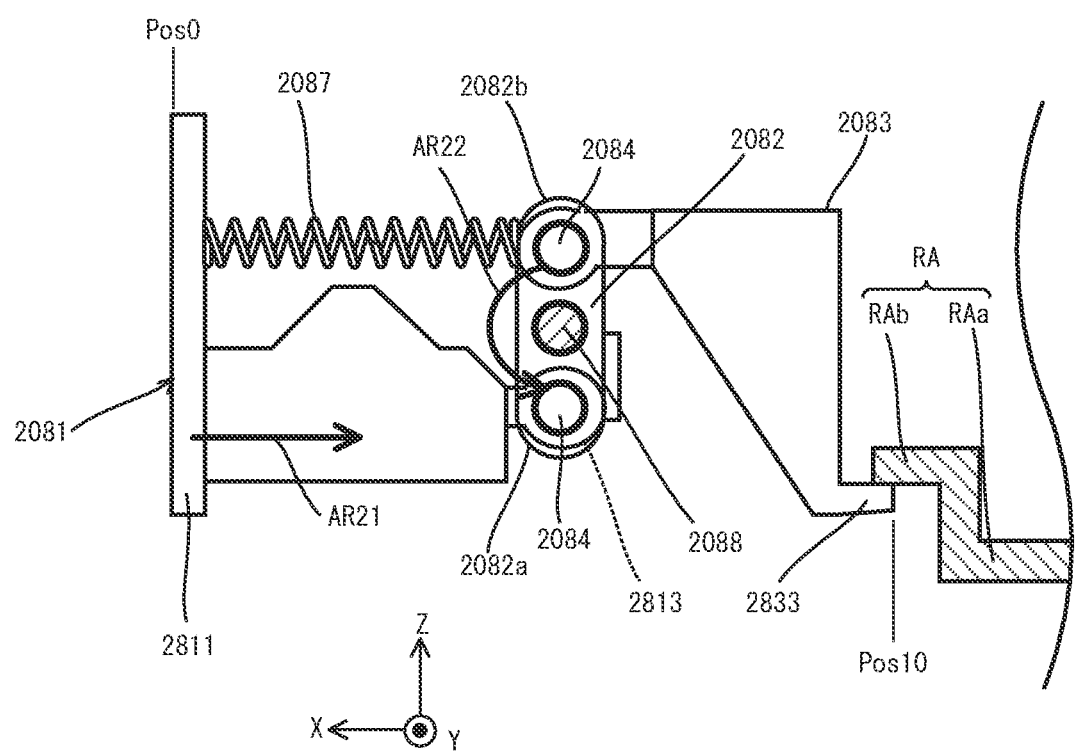
FIG. 21A is a partial schematic side view of the rail attachment assembly in Embodiment 2.
Figure 21B:
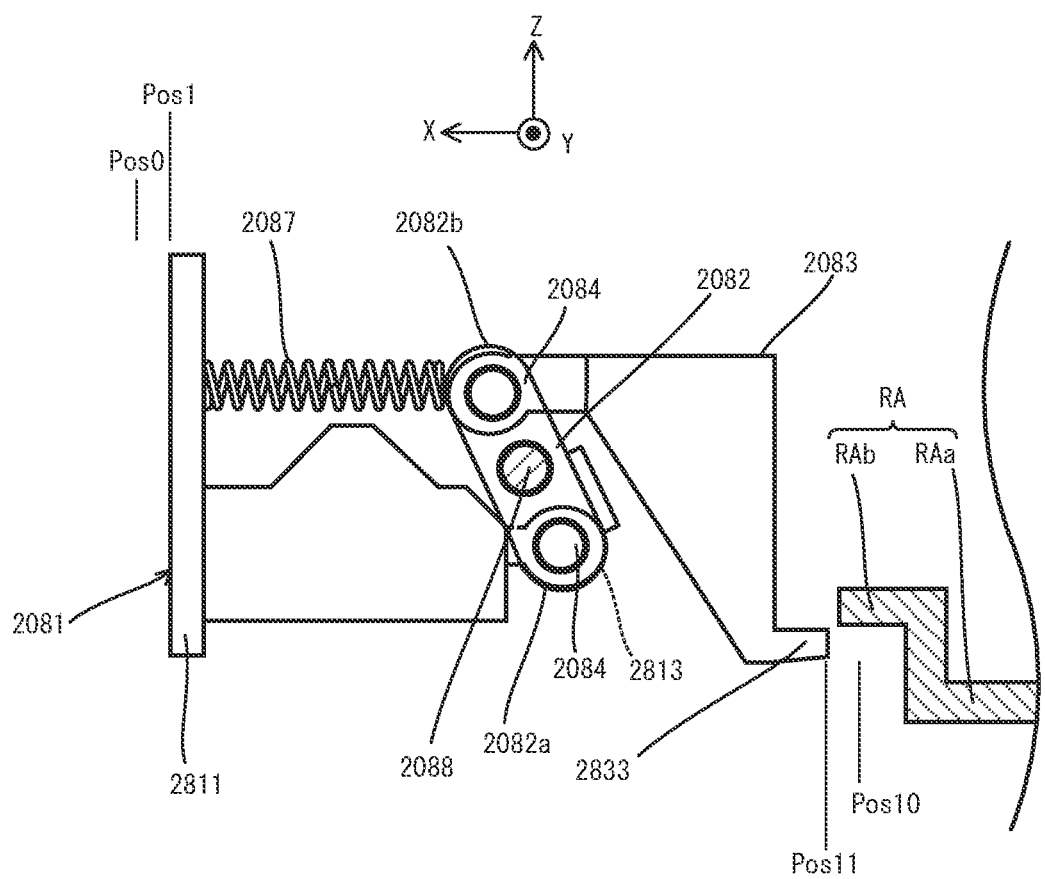
FIG. 21B is a partial schematic side view of the rail attachment assembly in Embodiment 2.
Figure 22A:
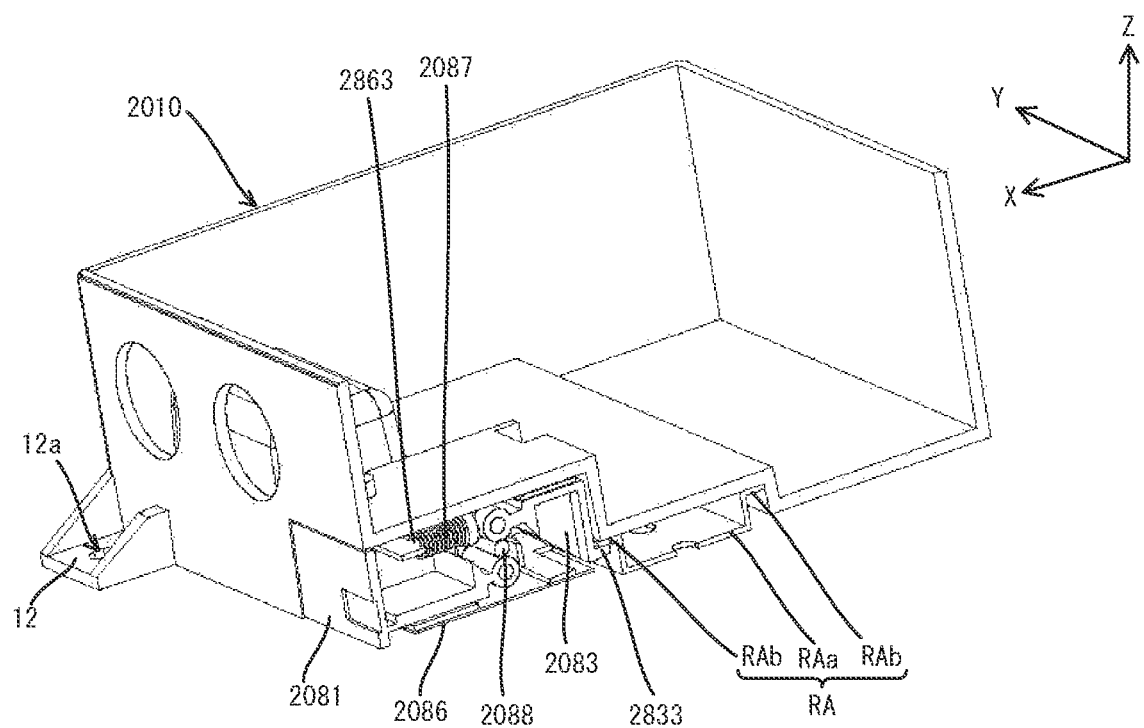
FIG. 22A is a cross-sectional view of the device according to Embodiment 2.
Figure 22B:
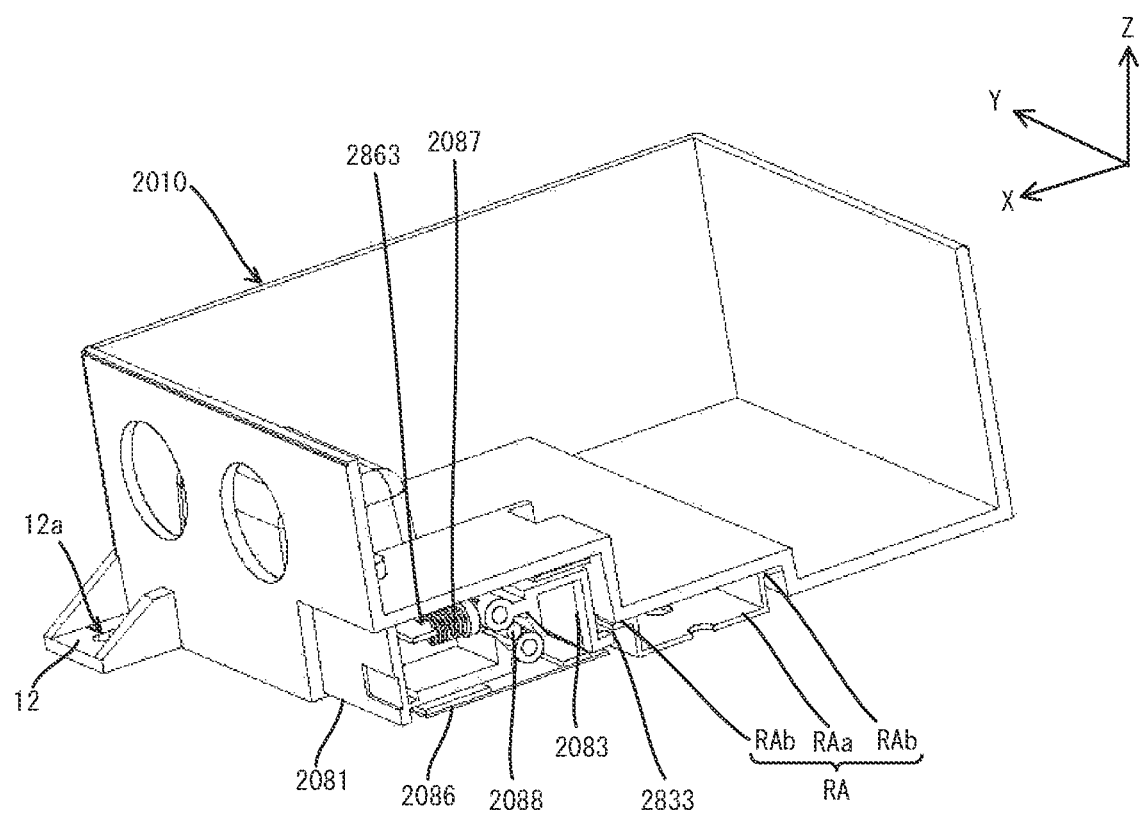
FIG. 22B is a cross-sectional view of the device according to Embodiment 2.

To attach the device 2 to the DIN rail RA, the pressing portion 2811 of the release button 2081 is first pressed as shown in FIGS. 20B, 21B, and 22B. In this state, the DIN rail RA is placed onto the rail mount 2010e to engage the engagement flange RAb on the DIN rail RA in −X-direction into the stoppers 161 and 162 on the housing 2010. The release button 2081 is then released, and as the restoring force of the coil spring 2087 moves the end 2082a of the connecting member 2082 in +X-direction, the connecting member 2082 rotates about the shaft 2088. The end 2082b of the connecting member 2082 moves in −X-direction accordingly, and the locking member 2083 connected to the end 2082b of the connecting member 2082 also moves in −X-direction to the locking position Pos10 as shown in FIGS. 20A, 21A, and 22A. In this manner, the device 2 is attached to the DIN rail RA.

In the device 2 according to the present embodiment, as described above, the locking member 2083 is positioned to lock the engagement flange RAb on the DIN rail RA at the center of the rail mount 2010e in Y-direction with the rail mount 2010e of the housing 2010 receiving the DIN rail RA. This structure reduces the imbalance at the locked position of the device 2 in Y-direction on the DIN rail RA, thus enabling firm and balanced attachment of the device 2 to the DIN rail RA As viewed in +X-direction, the release button 2081 is positioned at the center in Y-direction. This position may allow the release button 2081 to be easily pushed by a right-handed user as well as a left-handed user.

Figure 23:
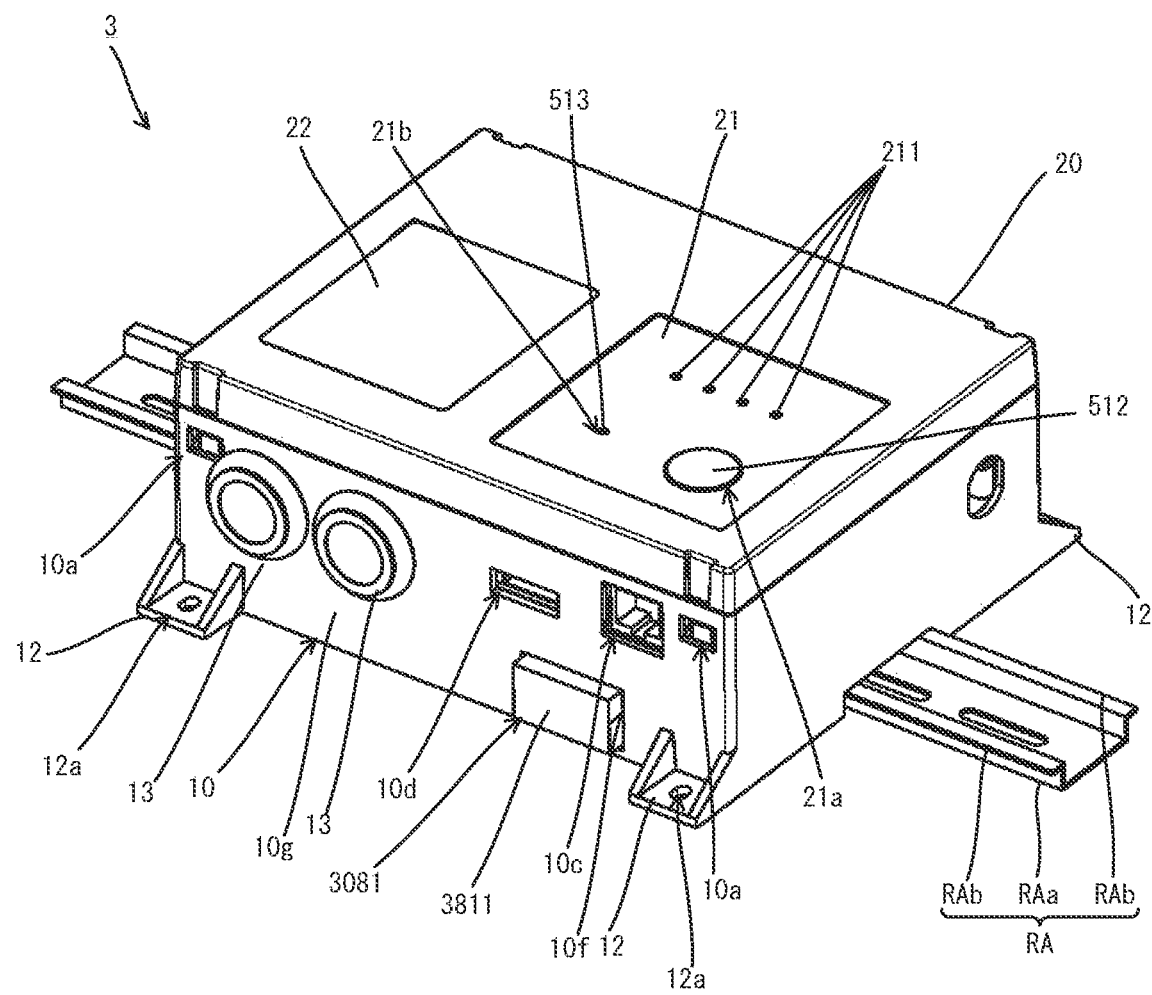
FIG. 23 is a perspective view of a device according to a modification.
Figure 24A:
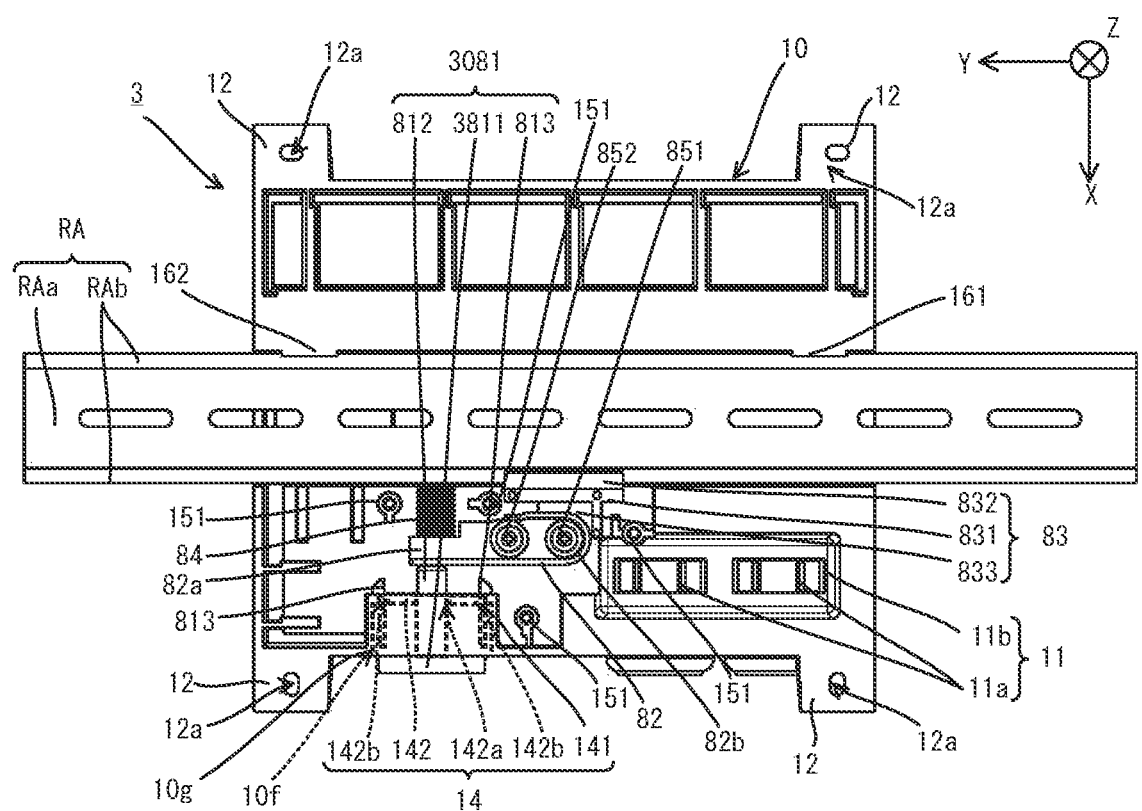
FIG. 24A is a bottom view of the device according to the modification.
Figure 24B:
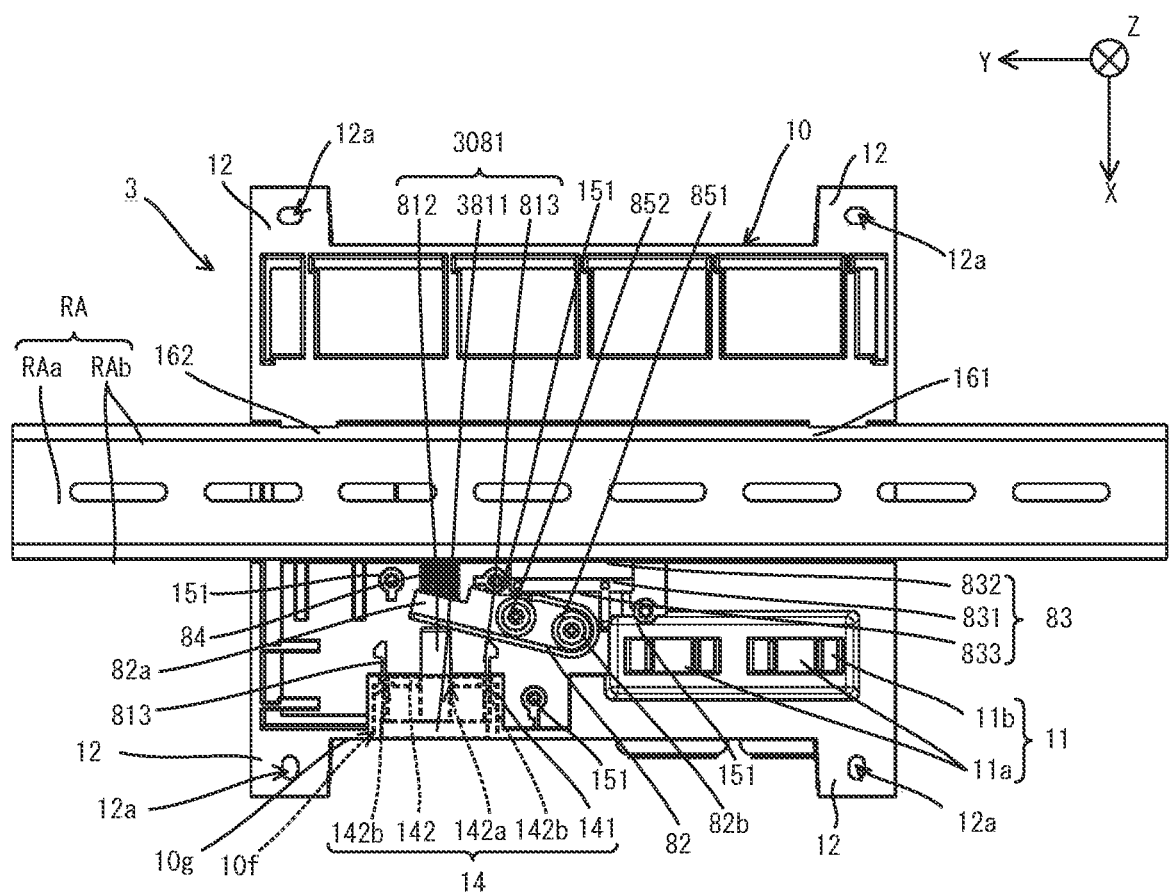
FIG. 24B is a bottom view of the device according to the modification.

Although the embodiments of the present disclosure have been described, the present disclosure is not limited to the above embodiments. For example, FIG. 23 shows a device 3 in which, with a release button 3081 at a standby position, a pressing portion 3811 protrudes outward from the opening 10f in the side wall 10g of the housing 10. In FIG. 23, the components that are also described in Embodiment 1 are given the same reference numerals as in FIG. 1. In the device 3 according to the present modification, as shown in FIG. 24A, when the release button 3081 is at a standby position Pos0, and the locking member 83 is at a locking position Pos10, the pressing portion 3811 of the release button 3081 protrudes outward from the side wall 10g of the housing 10. As shown in FIG. 24B, when the release button 3081 is at a pressed position Pos1, and the locking member 83 is at a release position Pos11, the pressing portion 3811 of the release button 3081 is flush with the outer periphery of the opening 10f in the outer wall of the side wall 10g of the housing 10.

In this structure, with the release button 3081 at the standby position Pos0, the pressing portion 3811 protrudes outward from the housing 10. This allows the user to feel for the release button 3081 and thus find the release button 3081 quickly. In this structure, with the locking member 83 at the release position Pos11, the pressing portion 3811 of the release button 3081 is flush with the outer periphery of the opening 10f in the outer wall of the side wall 10g of the housing 10. This allows the user to easily determine the amount by which the pressing portion 3811 is to be pressed to move the locking member 83 to the release position Pos11. This improves the workability of attaching and detaching the device 3 to and from the DIN rail RA.

Figure 25A:
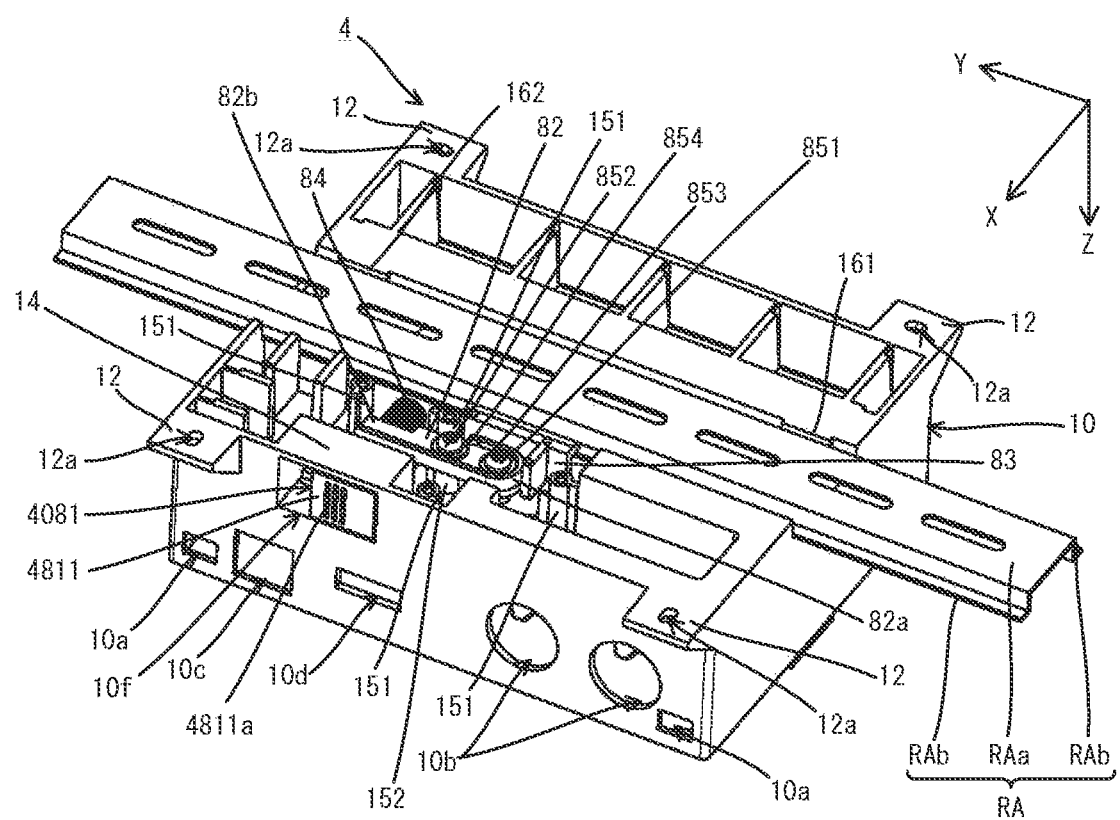
FIG. 25A is a partial perspective view of a device according to a modification.
Figure 25B:
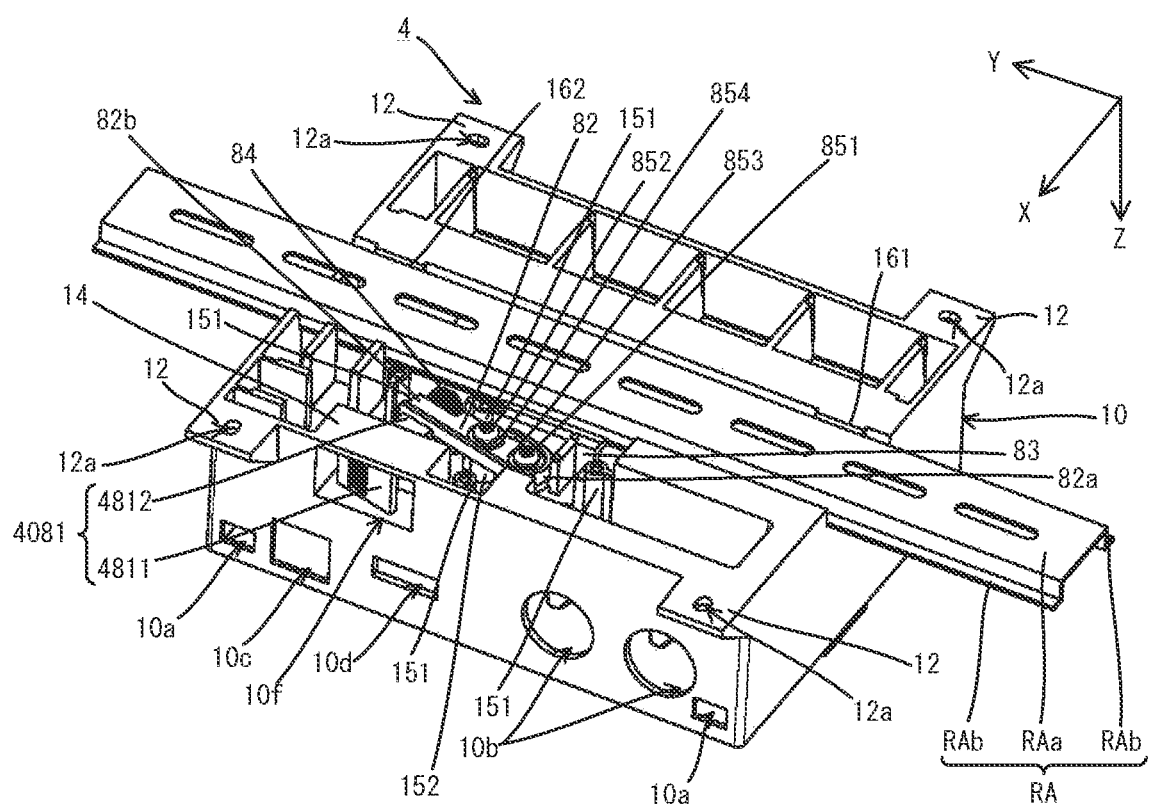
FIG. 25B is a partial perspective view of the device according to the modification.

The release button 81 and the arm 82 in Embodiment 1 are separate members, but this is not restrictive. For example, FIGS. 25A and 25B show a device 4 with a release button 4081 continuous with the end 82b of the arm 82. In FIGS. 25A and 25B, the components that are also described in Embodiment 1 are given the same reference numerals as in FIG. 3. The release button 4081 according to the present modification includes a pressing portion 4811 and a connecting portion 4812 that connects the pressing portion 4811 to the end 82b of the arm 82. The pressing portion 4811 has a plurality of linear protrusions 4811a to prevent slipping. As shown in FIG. 25A, with the release button 4081 at the standby position, when the pressing portion 4811 is pressed, the pressing portion 4811 moves at angles in accordance with the tilting of the arm 82 to the pressed position inside the housing 10.

The structure with the release button 4081 continuous with the end 82b of the arm 82 may include fewer components than the device 1 according to Embodiment 1 to simplify the process of assembling the device 4.

Figure 26A:
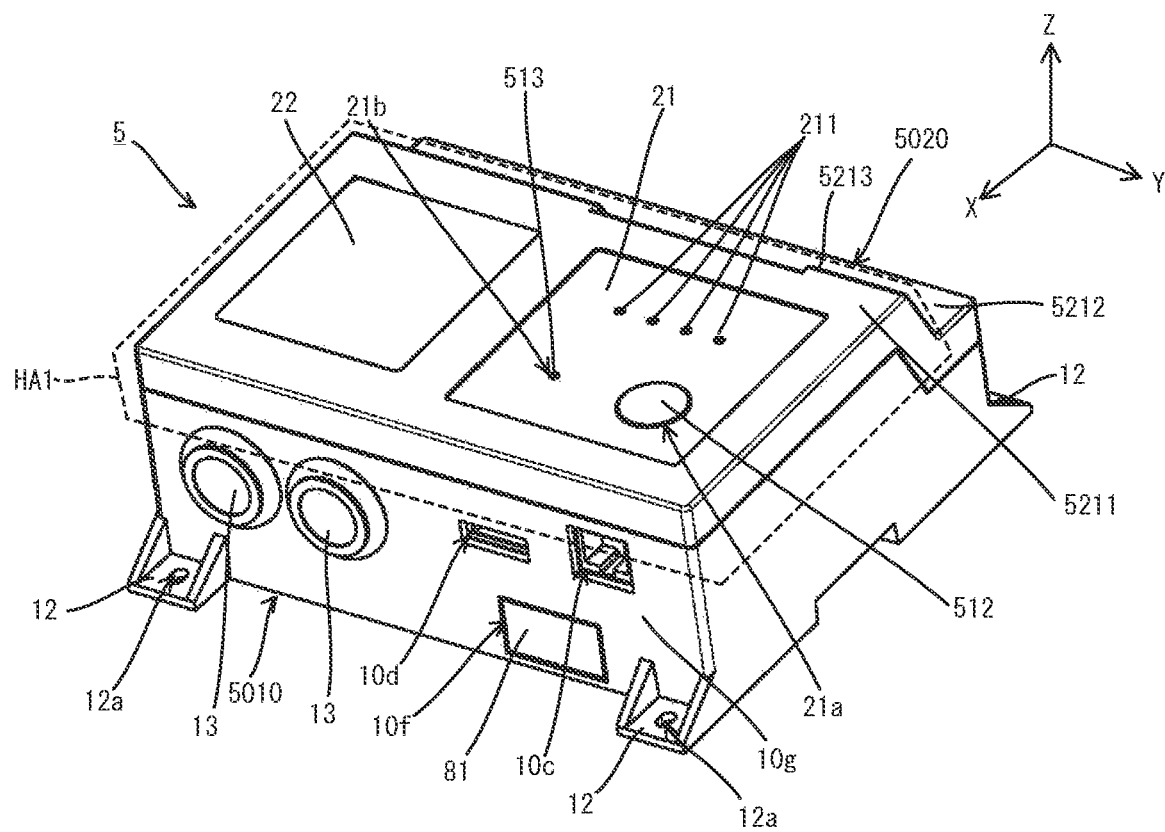
FIG. 26A is a perspective view of a device according to a modification.
Figure 26B:
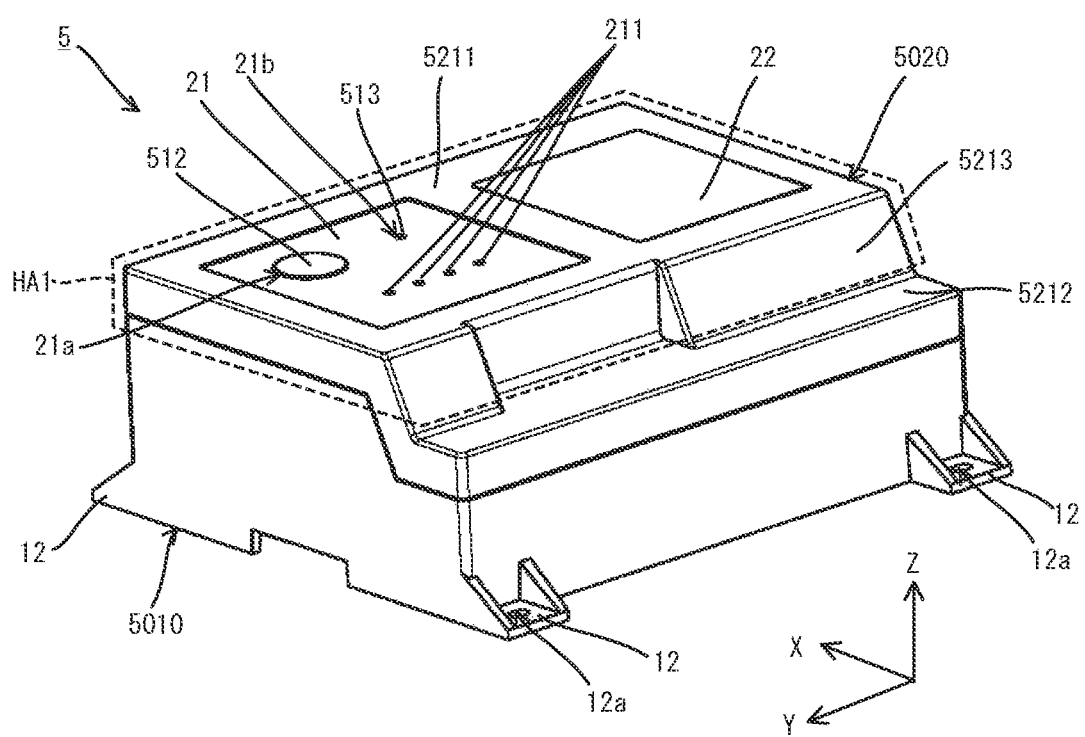
FIG. 26B is a perspective view of the device according to the modification.

The device in Embodiment 1 may be modified into a device 5 shown in FIGS. 26A and 26B with a cover 5020 including a first bottom wall 5211, a second bottom wall 5212 lower than the first bottom wall 5211 in −Z-direction, and aside wall 5213 continuous with the edge of the first bottom wall 5211 in −X-direction and the edge of the second bottom wall 5212 in +X-direction and inclined to the Z axis. In FIGS. 26A and 26B, the components that are also described in Embodiment 1 are given the same reference numerals as in FIG. 1. A housing 5010 is shaped to allow the cover 5020 to be attached to the side in +Z-direction. The section including the first bottom wall 5211 and the side wall 5213 forms a grip HA1 for the device 5. The first bottom wall 5211 has a width in X-direction within the distance between the first joint of the thumb and the first joint of the middle finger of an ordinary person's open hand, for example, a distance of 120 mm or less. The side wall 5213 may have a width in Z-direction equal to or more than about a half of the length from each fingertip to the first joint, or for example, 15 mm or more. Such a width allows the device 5 to be held by one hand.

Figure 27A:
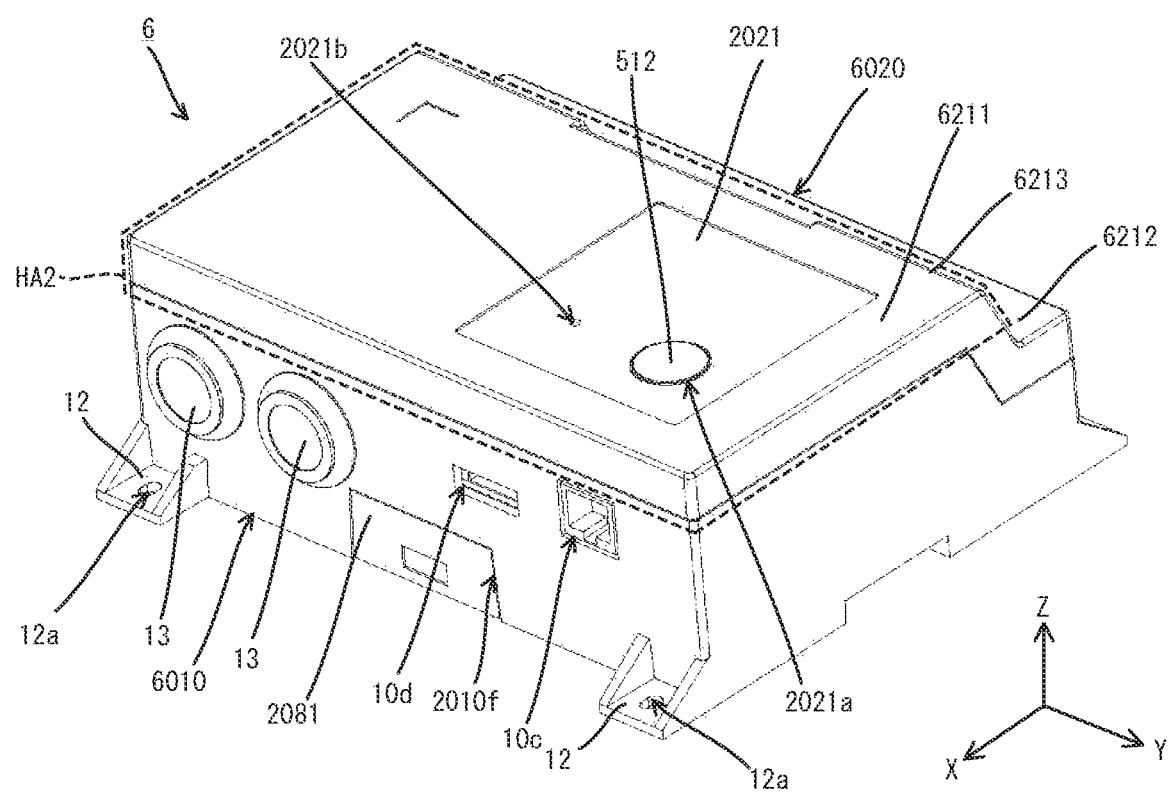
FIG. 27A is a perspective view of a device according to a modification.
Figure 27B:
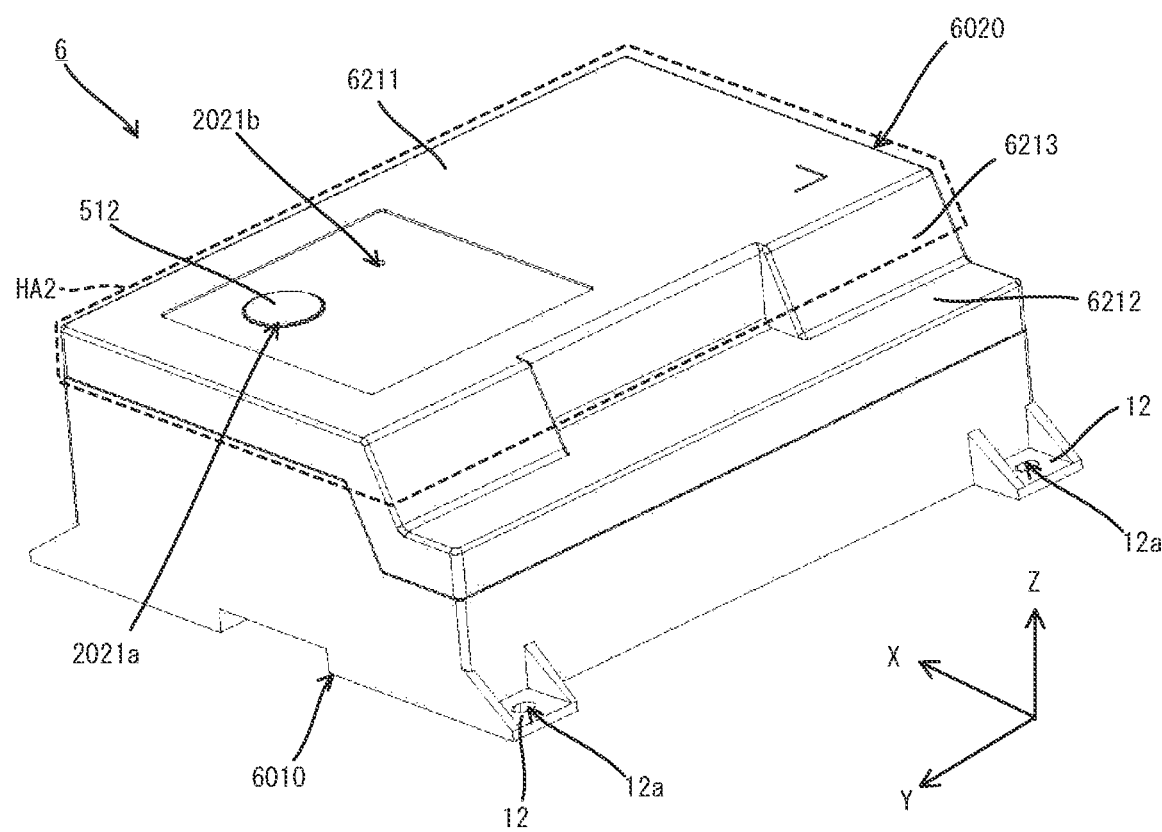
FIG. 27B is a perspective view of the device according to the modification.

The device in Embodiment 2 may be modified into a device 6 shown in FIGS. 27A and 27B with a cover 6020 including a first bottom wall 6211, a second bottom wall 6212 lower than the first bottom wall 6211 in −Z-direction, and a side wall 6213 continuous with the edge of the first bottom wall 6211 in −X-direction and the edge of the second bottom wall 6212 in +X-direction and inclined to the Z axis. In FIGS. 27A and 27B, the components that are also described in Embodiment 2 are given the same reference numerals as in FIG. 12. A housing 6010 is shaped to allow the cover 6020 to be attached to the side in +Z-direction. The section including the first bottom wall 6211 and the side wall 6213 forms a grip HA2 for the device 6.

This structure allows the device 5 or 6 to be attached to or detached from the DIN rail RA with the device 5 or 6 held by one hand, thus increasing the work efficiency of the user performing attachment to or detachment from the DIN rail RA.

Figure 28A:
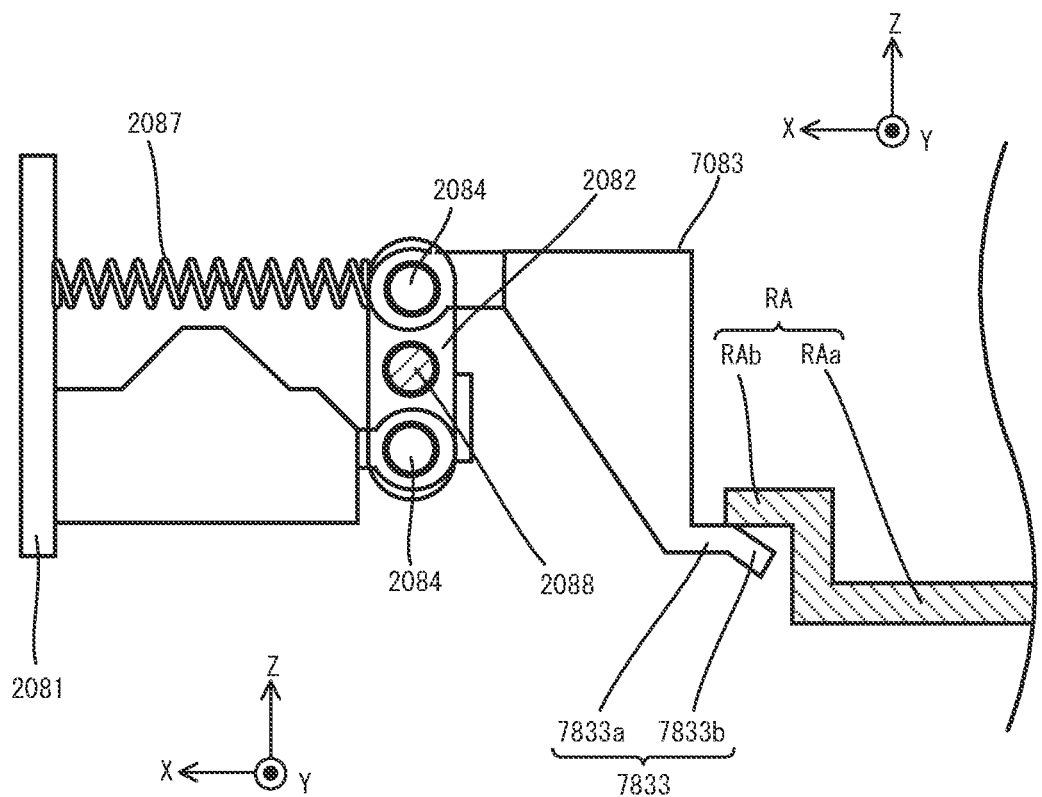
FIG. 28A is a schematic side view of a rail attachment assembly in a modification.
Figure 28B:
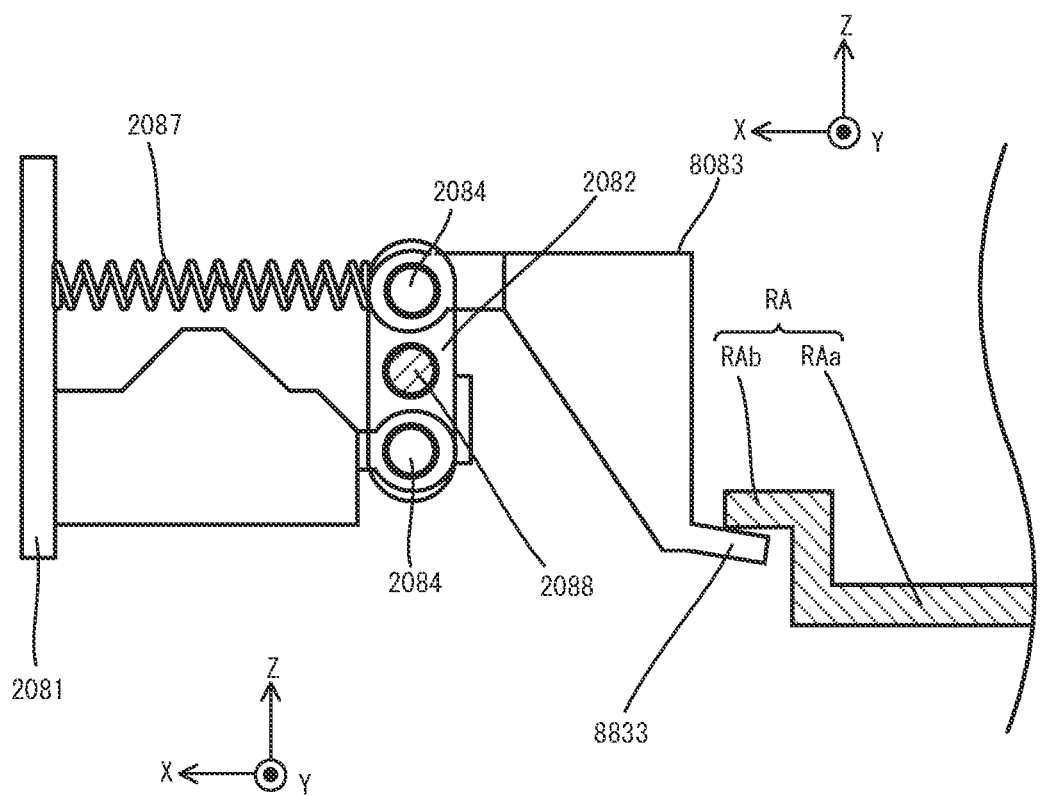
FIG. 28B is a schematic side view of a rail attachment assembly in a modification.
Figure 29:
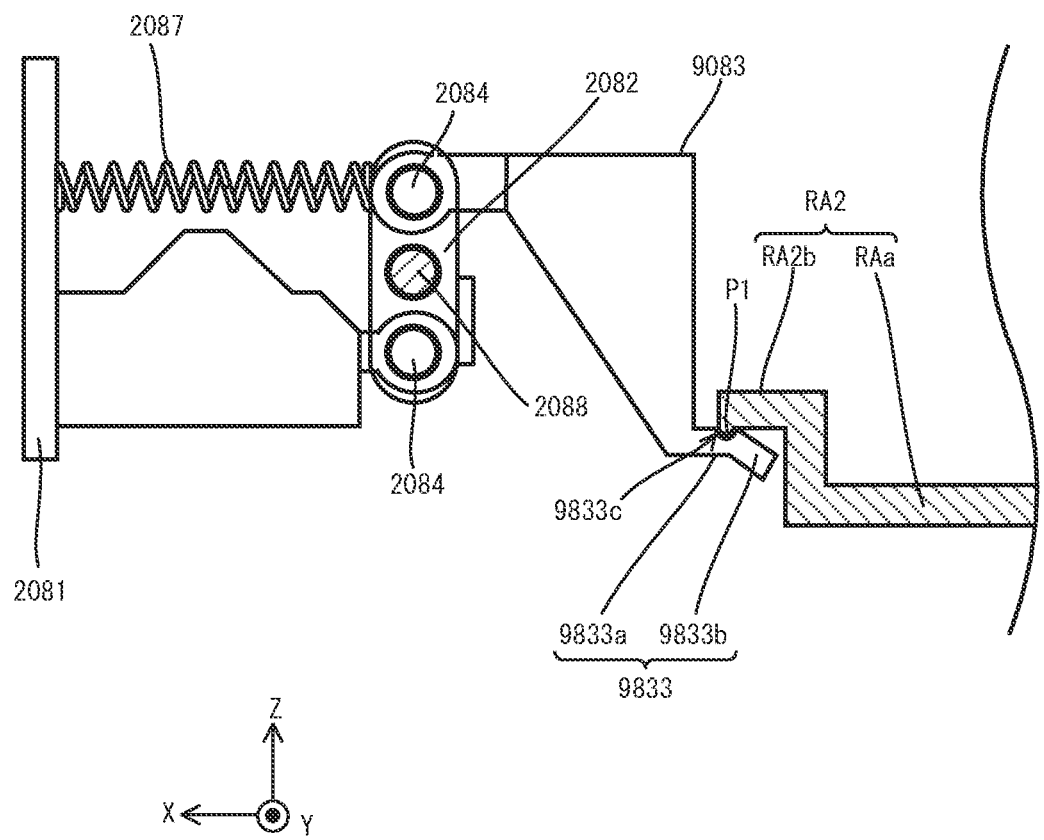
FIG. 29 is a schematic side view of a rail attachment assembly in a modification.

Embodiment 2 may be modified in the manner described below. As shown in FIG. 28A, for example, a locking member 7083 includes an engagement portion 7833 having a main portion 7833a that is a plate extending in X-direction, and an extending portion 7833b extending obliquely in −Z-direction from the distal end of the main portion 7833a in −X-direction. In another modification, as shown in FIG. 28B, a locking member 8083 may include an engagement portion 8833 extending obliquely in −Z-direction with respect to the X axis. In still another modification, as shown in FIG. 29, a DIN rail RA2 may include an engagement flange RA2b with a projection P1 extending from the distal end. In this case, a locking member 9083 may include a main portion 9833a that is a plate extending in X-direction with an engagement recess 9833c at the distal end for receiving the projection P1, and an extending portion 9833b extending obliquely in −Z-direction from the distal end of the main portion 9833a in −X-direction.

In a modification of Embodiment 1, a device may have a coil spring 84 placed in a state compressed from the natural length. Such a device may not include a coil spring 85.

In Embodiments 1 and 2, the target device to be operated by the devices 1 and 2 is an air conditioner. However, the target device to be operated by the devices 1 and 2 may not be an air conditioner, but may be other house equipment.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The invention claimed is:

1. A device attachable to a rail being elongated and including engagement flanges on two lateral edges of the rail, the device comprising:
    a housing including
        a rail mount to receive the rail with a longitudinal direction of the rail aligned with a predetermined first direction, and
        a stopper to lock an engagement flange on a first lateral edge of the rail with the rail mount receiving the rail;
    a locking member to be at a locking position to lock an engagement flange on a second lateral edge of the rail and at a release position to unlock the engagement flange on the second lateral edge with the rail mount receiving the rail;
    a release button including a pressing portion to be pressed by a user to move the locking member to the release position, the release button being located in the housing with the pressing portion exposed outside the housing;
    a driver pivotally mounted at a first longitudinal end thereof directly on the locking member to move the locking member from the locking position to the release position in response to movement, by a press of the pressing portion, of the release button from a predetermined standby position to a pressed position deeper in the housing than the standby position; and
    an urging member to urge the release button in a direction from the pressed position toward the standby position.

2. The device according to claim 1, wherein
the driver includes an arm being elongated and including the longitudinal first end connected to the locking member and a second end to be moved by the release button, and
the housing includes
    a support rib pivotally supporting a central portion of the arm, and
    a tubular portion with a tube axis aligned with a second direction perpendicular to the first direction, the tubular portion receiving the release button that is movable inside in the second direction.

3. The device according to claim 2, wherein
as viewed in the second direction, one of the release button and the locking member is at a position shifted in the first direction from the other one of the release button and the locking member.

4. The device according to claim 2, wherein
the release button is continuous with the second end of the arm.

5. The device according to claim 1, further comprising:
a holder accommodating and holding the driver,
wherein
the driver includes
    two coupling sections being elongated and each having a longitudinal first end connected to the locking member and a second end connected to the release button, and
    a shaft pivotally supporting a central portion of each of the two coupling sections, the shaft being an elongated rod, and
the holder includes a support section supporting two longitudinal ends of the shaft.

6. The device according to claim 1, wherein
when the locking member is at the locking position with the rail mount receiving the rail, the locking member is positioned to lock the engagement flange on the rail in a central portion of the rail mount in the first direction.

7. The device according to claim 1, wherein
the release button is arranged such that
    when the release button is at the standby position, a portion of the release button including at least the pressing portion protrudes outward from an opening in a peripheral wall of the housing, and
    when the release button is at the pressed position, the pressing portion is flush with an outer periphery of the opening in an outer wall of the housing.

8. The device according to claim 1, further comprising:
a cover over at least a part of the housing, the cover including a grip.

9. The device according to claim 3, wherein
the release button includes:
    the pressing portion exposed outside the housing;
    a protrusion provided for the pressing portion and protruding into the housing; and
    a protruding section protruding from the pressing portion in a same direction as the protrusion and having a hook at a distal end,
the arm includes:
    a main section that is elongated, the main section having one longitudinal end connected to the locking member; and
    an extension extending in a thickness direction of the main section from two lateral edges at another end of the main section,
the release button and the arm are positioned such that a distal end of the protrusion faces the extension, and
the hook is locked on an end that is near to the extension in the tubular portion with the release button at the standby position.

10. The device according to claim 1, wherein
the locking member includes:
    a body; and
    an engagement portion extending from the body and configured to lock the engagement flange on the first lateral edge of the rail in a case in which the locking member is at the locking position with the rail mount receiving the rail, and the engagement portion includes:
  a main portion; and
  an extending portion, at least a portion of the extending portion extending in a direction intersecting with a direction in which the locking member moves from the locking position to the release position.

* * * * *